US012482636B2

(12) United States Patent
Jafarian Tehrani et al.

(10) Patent No.: US 12,482,636 B2
(45) Date of Patent: Nov. 25, 2025

(54) PROCESS MODULE CHAMBER PROVIDING SYMMETRIC RF RETURN PATH

(71) Applicant: Lam Research Corporation, Fremont, CA (US)

(72) Inventors: Sam Jafarian Tehrani, Fremont, CA (US); Karl Frederick Leeser, West Linn, OR (US); David French, Fort Myers, FL (US); John Michael Wiltse, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 11 days.

(21) Appl. No.: 18/682,889

(22) PCT Filed: Aug. 4, 2022

(86) PCT No.: PCT/US2022/039397

§ 371 (c)(1),
(2) Date: Feb. 9, 2024

(87) PCT Pub. No.: WO2023/018596

PCT Pub. Date: Feb. 16, 2023

(65) Prior Publication Data

US 2024/0371604 A1 Nov. 7, 2024

Related U.S. Application Data

(60) Provisional application No. 63/232,590, filed on Aug. 12, 2021.

(51) Int. Cl.
*H01J 37/32* (2006.01)

(52) U.S. Cl.
CPC .... *H01J 37/32174* (2013.01); *H01J 37/3244* (2013.01); *H01J 37/32642* (2013.01)

(58) Field of Classification Search
CPC ............ H01J 37/32174; H01J 37/3244; H01J 37/32642
See application file for complete search history.

(56) References Cited

U.S. PATENT DOCUMENTS 6,602,381 B1 * 8/2003 Lenz ................ H01J 37/32623 156/345.43
8,070,925 B2 * 12/2011 Hoffman ................ C23C 14/35 204/298.16

(Continued)

FOREIGN PATENT DOCUMENTS

WO WO-2021086691 A1 * 5/2021 ............... B08B 6/00
WO WO-2023018596 A1 * 2/2023 ........ H01J 37/32642

(Continued)

OTHER PUBLICATIONS

ISR & WO PCT/US2022/039397, dated Aug. 4, 2022, Total 13 pages.

*Primary Examiner* — Adam D Houston
(74) *Attorney, Agent, or Firm* — PENILLA IP, APC

(57) ABSTRACT

An apparatus including a multi-station processing chamber with a top plate and a bottom portion encloses stations each including a pedestal assembly. A spindle centrally located between the stations is configured to rotate about a central axis, and is electrically connected to the bottom portion. An actuator controls movement of the spindle in the Z-direction. An indexer connected to the spindle rotates with the spindle, and includes extensions each configured to interface with a corresponding substrate for substrate transfer. An electrically conductive interface movably connected to the top plate provides an RF return path. Another actuator coupled to the grounding interface controls movement of the electrically conductive interface in the Z-direction. The electrically conductive interface moves downwards in the Z-direction to make contact with the indexer when each of the (Continued)

plurality of extensions is parked and the spindle is moved to a lower position during plasma processing.

21 Claims, 16 Drawing Sheets

(56) References Cited

U.S. PATENT DOCUMENTS

| | | | | |
|---|---|---|---|---|
| 10,763,090 | B2 * | 9/2020 | Allen | C23C 14/548 |
| 11,348,760 | B2 * | 5/2022 | Koshiishi | H01J 37/32082 |
| 11,761,078 | B2 * | 9/2023 | Wu | H01J 37/3455 204/298.13 |
| 12,002,611 | B2 * | 6/2024 | Rough | H01F 27/2828 |
| 12,159,770 | B2 * | 12/2024 | Long | H01J 37/32522 |
| 12,288,673 | B2 * | 4/2025 | Oliveti | H03H 7/38 |
| 2010/0096261 | A1 * | 4/2010 | Hoffman | C23C 14/35 204/298.16 |
| 2013/0133833 | A1 | 5/2013 | Carman et al. | |
| 2017/0053781 | A1 * | 2/2017 | Lavoie | H01J 37/3244 |
| 2018/0286639 | A1 * | 10/2018 | Zucker | H01J 37/32449 |
| 2018/0358210 | A1 * | 12/2018 | Ma | H01J 37/32715 |
| 2019/0006155 | A1 * | 1/2019 | Zhao | C23C 16/505 |
| 2020/0312624 | A1 | 10/2020 | Weichart et al. | |
| 2024/0055241 | A1 * | 2/2024 | Kong | G05D 23/1917 |
| 2024/0371604 | A1 * | 11/2024 | Jafarian Tehrani | H01J 37/32174 |
| 2025/0022739 | A1 * | 1/2025 | Gwinn | H01L 21/6831 |
| 2025/0054737 | A1 * | 2/2025 | Elumalai | H01J 37/32724 |
| 2025/0112029 | A1 * | 4/2025 | Garcia De Gorordo | H01J 37/321 |

FOREIGN PATENT DOCUMENTS

| | | | | | |
|---|---|---|---|---|---|
| WO | WO-2023043795 | A1 * | 3/2023 | | H01J 37/32183 |
| WO | WO-2024249699 | A1 * | 12/2024 | | H01J 37/32449 |

* cited by examiner

PROCESS MODULE CHAMBER PROVIDING SYMMETRIC RF RETURN PATH

CLAIM OF PRIORITY

This application is a national stage filing of and claims priority, under 35 U.S.C. § 371, to PCT/US2022/039397, filed on Aug. 4, 2022, and titled "PROCESS MODULE CHAMBER PROVIDING SYMMETRIC RF RETURN PATH", which claims priority, under 35 U.S.C. § 119 (e), to U.S. Provisional Application No. 63/232,590 filed on Aug. 12, 2021, and titled "PROCESS MODULE CHAMBER PROVIDING SYMMETRIC RF RETURN PATH", both of which are incorporated by reference herein in their entireties.

TECHNICAL FIELD

The present embodiments relate to semiconductor wafer processing equipment tools, and more particularly, a multi-station chamber with a more symmetric radio frequency (RF) ground return path for each station through the center of the chamber.

BACKGROUND OF THE DISCLOSURE

There are many types of film deposition processes commonly used in the semiconductor fabrication field. One example process is referred to as a plasma-enhanced chemical vapor deposition (PECVD), which is a type of plasma deposition that is used to deposit thin films from a gas state (i.e., vapor) to a solid state on a substrate such as a wafer. PECVD systems convert a liquid precursor into a vapor precursor, which is delivered to a chamber. PECVD systems may include a vaporizer that vaporizes the liquid precursor in a controlled manner to generate the vapor precursor.

Another example film deposition process is referred to as atomic layer deposition (ALD), which also utilizes plasma energy to facilitate the deposition. ALD systems are used to produce very thin films that are highly conformal, smooth, and possess excellent physical properties. ALD uses volatile gases, solids, or vapors that are sequentially introduced (or pulsed) over a heated substrate. A first precursor is introduced as a gas, which is absorbed (or adsorbed) into the substrate and the reactor chamber is cleared of the gaseous precursor. A second precursor is introduced as a gas, which reacts with the absorbed precursor to form a monolayer of the desired material. By regulating this sequence, the films produced by ALD are deposited a monolayer at a time by repeatedly switching the sequential flow of two or more reactive gases over the substrate.

Chambers used to process PECVD and ALD processes require highly engineered structural construction so that the resulting films deposited on substrates are as uniform as possible and processes are repeatable from wafer-to-wafer. In such chambers, radio frequency (RF) power is supplied to enable excitation of gases in the form of a plasma, which leads to the deposition of a material film. The delivery of RF power is typically applied to either the substrate support (i.e., the pedestal) or the shower head. In either configuration, RF power applied to the chamber requires a return path. Commonly, the conductive chamber walls provide this return path.

This process has worked well for some time, but as the demand continues to push for the manufacture of smaller feature sizes, more stringent demands are continually made upon chamber construction and engineered geometries. For example, some chamber designs usable for PECVD as well as ALD include multi-station designs. Multi-station designs are those that enable deposition processes to occur in multiple stations at the same time. Such multi-station designs have added complexities associated with neighboring processing by other stations.

Furthermore, multi-station process modules that are not symmetric about each of the wafers can have issues with asymmetric RF return paths, especially at higher frequencies. For example, the RF return path is not axisymmetric about a corresponding wafer because the conductive path exists closer to the wafer on the edge of the chamber rather than towards a rotating mechanism in the center of the chamber. Due to this asymmetry, non-uniformities may appear on the corresponding wafer.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

It is in this context that embodiments of the disclosure arise.

SUMMARY

The present embodiments relate to process chambers used for processing semiconductor wafers. In particular, embodiments of the present disclosure increase the symmetry of the RF return path in multi-station process chambers by providing a central RF return in the chamber to decrease non-uniformity on process wafers. Several inventive embodiments of the present disclosure are described below.

Embodiments of the present disclosure provide for an apparatus configured for plasma processing. The apparatus includes a multi-station processing chamber including a top plate and a bottom portion, the multi-station processing chamber configured to enclose a plurality of stations each including a pedestal assembly for supporting a substrate for processing. The apparatus includes a spindle centrally located between the plurality of stations and configured to rotate about a central axis, wherein the spindle is electrically connected to the bottom portion. The apparatus includes a first actuator coupled to the spindle and configured for controlling movement of the spindle in the Z-direction. The apparatus includes an indexer connected to the spindle and configured to rotate with the spindle, wherein the indexer includes a plurality of extensions each configured to interface with a corresponding substrate for transfer to and from a station. The apparatus includes an electrically conductive interface movably connected to the top plate. The apparatus includes a second actuator coupled to the electrically conductive interface and configured for controlling movement of the electrically conductive interface in the Z-direction. The electrically conductive interface is configured to move downwards in the Z-direction to make contact with the indexer when each of the plurality of extensions is parked and the spindle is moved to a lower position during plasma processing.

Other embodiments of the present disclosure provide for an apparatus configured for plasma processing. The apparatus includes a multi-station processing chamber including a top plate and a bottom portion, the multi-station processing chamber configured to enclose a plurality of stations each including a pedestal assembly for supporting a substrate for processing. The apparatus includes a spindle centrally located between the plurality of stations and configured to rotate about a central axis. The apparatus includes a first actuator coupled to the spindle and configured for controlling movement of the spindle in the Z-direction. The apparatus includes an indexer connected to the spindle and configured to rotate with the spindle about the central axis, wherein the indexer includes a plurality of extensions each configured to interface with a corresponding substrate for transfer to and from a station. The apparatus includes an electrically conductive interface movably connected to the top plate. The apparatus includes a second actuator coupled to the electrically conductive interface and configured for controlling movement of the grounding interface in the Z-direction. The electrically conductive interface has a lower end portion that spans a diameter of the indexer. In addition, the electrically conductive interface is configured to move downwards in the Z-direction to make contact with a conductive structure adjacent to the spindle and indexer when each of the plurality of extensions is parked and the spindle is moved to a lower position during plasma processing. The conductive structure is electrically coupled to the bottom portion.

Still other embodiments of the present disclosure provide for an apparatus configured for plasma processing. The apparatus includes a multi-station processing chamber including a top plate and a bottom portion, the multi-station processing chamber configured to enclose a plurality of stations each including a pedestal assembly for supporting a substrate for processing. The apparatus includes a spindle centrally located between the plurality of stations and configured to rotate about a central axis, wherein the spindle is electrically connected to the bottom portion. The apparatus includes an actuator coupled to the spindle and configured for controlling movement of the spindle in the Z-direction. The apparatus includes an indexer connected to the spindle and configured to rotate with the spindle, wherein the indexer includes a plurality of extensions each configured to interface with a corresponding substrate for transfer to and from a station. The apparatus includes an electrically conductive interface connected to the indexer. The spindle is configured to move upwards in the Z-direction to a higher position so that the electrically conductive interface makes contact with the top portion during plasma processing. Each of the plurality of extensions is parked when the spindle is in the higher position.

Still other embodiments of the present disclosure provide for an apparatus configured for plasma processing. The apparatus includes a multi-station processing chamber including a top plate and a bottom portion, the multi-station processing chamber configured to enclose a plurality of stations each including a pedestal assembly for supporting a substrate for processing. The apparatus includes a spindle centrally located between the plurality of stations and configured to rotate about a central axis, wherein the spindle is movably and electrically connected to the top plate. The apparatus includes an actuator coupled to the spindle and configured for controlling movement of the spindle in the Z-direction. The apparatus includes an indexer connected to the spindle and configured to rotate with the spindle, wherein the indexer includes a plurality of extensions each configured to interface with a corresponding substrate for transfer to and from a station. The apparatus includes an electrically conductive interface connected to the indexer. The apparatus includes a conductive structure electrically connected to the bottom portion. The spindle is configured to move downwards in the Z-direction to a lower position so that the electrically conductive interface makes contact with the conductive structure during plasma processing. Each of the plurality of extensions is parked when the spindle is in the lower position.

Still other embodiments of the present disclosure provide for an apparatus configured for plasma processing. The apparatus includes a multi-station processing chamber including a top plate and a bottom portion, the multi-station processing chamber configured to enclose a plurality of stations each including a pedestal assembly for supporting a substrate for processing. The apparatus includes a spindle centrally located between the plurality of stations and configured to rotate about a central axis, wherein the spindle is electrically connected to the bottom portion. The apparatus includes an actuator coupled to the spindle and configured for controlling movement of the spindle in the Z-direction. The apparatus includes an indexer connected to the spindle and configured to rotate with the spindle, wherein the indexer includes a plurality of extensions each configured to interface with a corresponding substrate for transfer to and from a station. The apparatus includes an electrically conductive interface connected to the indexer, wherein an end of the electrically conductive interface extends into a travel space of the top plate, wherein the electrically conductive interface moves with the spindle. The apparatus includes an electrically conductive (e.g., fluid) seal and bellows assembly connected to the top plate around an opening of the travel space. The end of the electrically conductive interface engages with the electrically conductive seal and bellows assembly through bearings to make continuous contact with the top plate when the spindle is parked or moving in the Z-direction. Each of the plurality of extensions is parked when the spindle is moved to a lower position during plasma processing.

Still other embodiments of the present disclosure provide for an apparatus configured for facilitating an RF return path within a multi-station processing chamber. The apparatus includes an upper post assembly, wherein the upper post assembly is electrically conductive. The apparatus includes a lower post assembly movably connected to the upper post assembly, wherein the lower post assembly is electrically conductive. The upper post assembly and the lower post assembly are configured to provide an RF return path between a top plate and a bottom portion of a multi-station processing chamber.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

DETAILED DESCRIPTION

Figure 1:
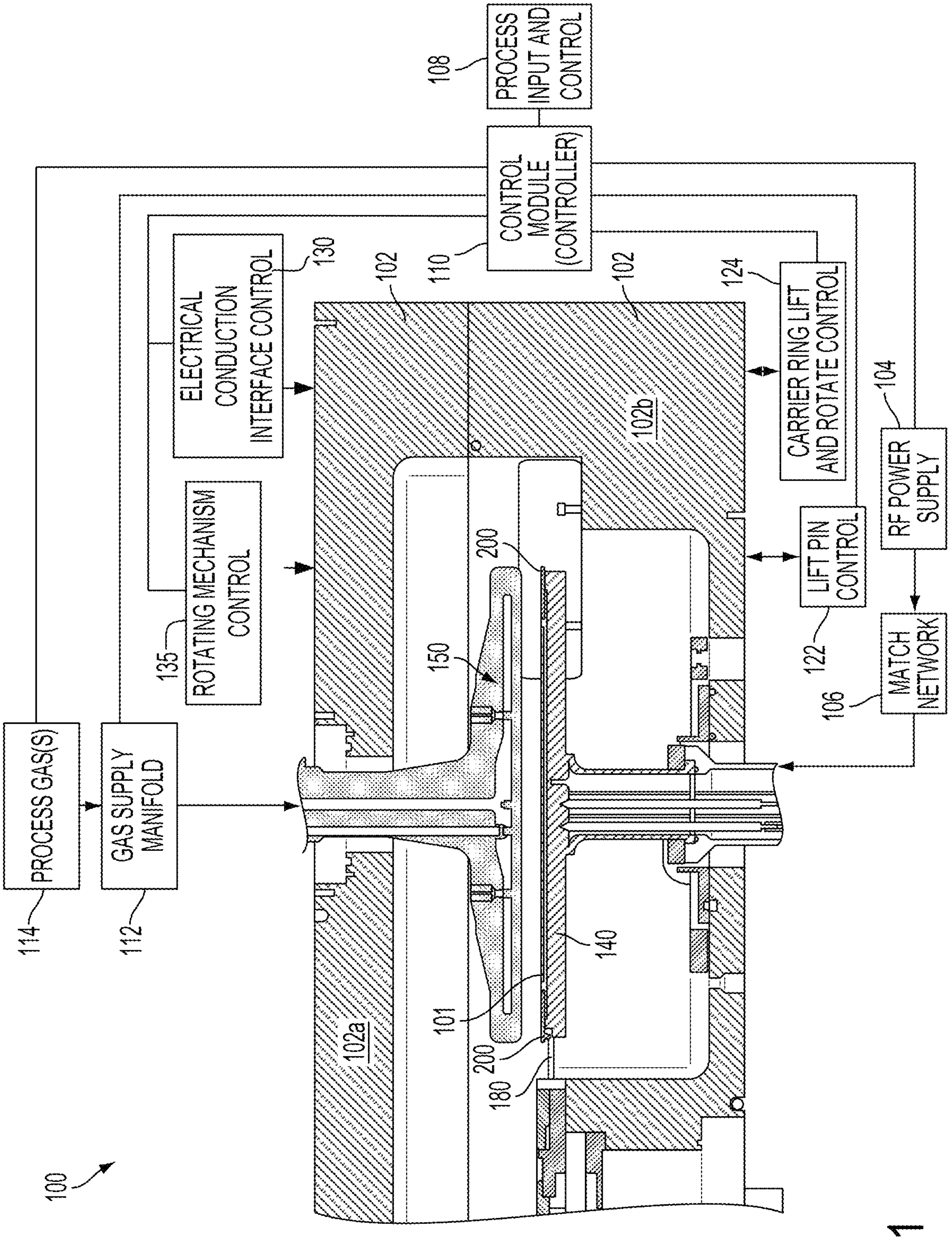
FIG. 1 illustrates a substrate processing system, which is used to process a wafer, e.g., to perform films thereon, in accordance with one embodiment of the present disclosure.

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe systems and apparatus for increase the symmetry of the RF return path in multi-station process chambers by providing a central electrically conductive path of the chamber to decrease non-uniformity on process wafers. In embodiments, a multi-station chamber is disclosed, and in one implementation is a quad station module that are arranged in a square configuration with a rotating mechanism in a center location. The quad station module is configured to process four wafers on four pedestals in a large, open, square chamber including an upper portion and a bottom portion. Each pedestal is configured to support a substrate, and is disposed in a lower chamber portion that includes outer walls and inner walls to define a space for each of the pedestals of the four chambers. In some implementations, each pedestal includes a carrier ring. In some embodiments, the carrier ring is referred to as a plasma focus ring. The lower chamber portion includes outer walls and inner walls to define a space for each of the pedestals of the four chambers. The chamber further includes an upper chamber portion or top plate. The upper chamber portion is configured to mate over the lower chamber portion. The upper chamber portion includes four shower heads and each of the four shower heads is configured to be aligned over a respective pedestal of a respective station. Wherein when a radio frequency (RF) power is provided to either the shower head or the pedestal of each station, the RF power is provided with an RF return via the conductive plate that symmetrically surrounds each process opening of each station, in embodiments.

In some implementations an electrically conductive structure (e.g., electrically conductive interface, electrically conductive plate, one or more electrically conductive rods, etc.) is implemented to provide for an RF return path. For instance, the conductive plate may be disposed over the inner walls and attached to the outer walls. The conductive plate has a center opening configured to receive the rotating mechanism and process openings for the stations that has a diameter that is larger than the pedestal and/or carrier ring. Conventionally, there is no central electrically conductive path for the chamber; however, embodiments of the present disclosure provides a symmetric conduction path for each station by adding a structure near the center of the spindle of the rotating mechanism that can electrically connect the top plate and the bottom portion of the chamber together and provide for central RF return paths. This central conduction path can be implemented through the spindle of the rotating mechanism, or with a separate conductive rod, or set of rods near the spindle, or with any adequate structure that provides a return to the lower portion of the chamber. This provides a more symmetric RF return path for the RF signal coming from the substrate and plasma through the shower head to reach the top plate. Embodiments of the present disclosure provide for a more cost-effective solution for symmetric RF electrical conduction by using common aluminum stock sizes, and common machining features to allow for the possible tolerance stackup of the chamber. In one embodiment, the machined features allow for a non-helical spring-like structure used for a conductive interface electrically connecting the top plate and the lower portion of the chamber. A helical current path may not be desirable due to the magnetic field that can be generated or amplified, whereas a stepped beam flexure structure of embodiments of the present disclosure may cause the current to zig-zag, thereby producing a less detrimental magnetic field.

Advantages of the various embodiments providing for central grounding structures of a chamber include increasing the symmetry of RF return paths for each of the stations in the multi-station chamber that is not symmetric about wafers in the stations. Further embodiments provide for decreased non-uniformities in process wafers because of the increased symmetry of RF return paths of a station and between stations in the multi-station chamber.

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

FIG. 1 illustrates a substrate processing system 100, which is used to process a wafer 101. The system includes a chamber 102 having a lower chamber portion 102*b* and an upper chamber portion 102*a*. A center column is configured to support a pedestal 140, which in one embodiment is a powered electrode. The pedestal 140 is electrically coupled to power supply 104 via a match network 106. The power supply is controlled by a control module 110, e.g., a controller. The control module 110 is configured to operate the substrate processing system 100 by executing process input and control 108. The process input and control 108 may include process recipes, such as power levels, timing parameters, process gasses, mechanical movement of the wafer 101, etc., such as to deposit or form films over the wafer 101.

The center column also includes lift pins (not shown), which are controlled by lift pin control 122. The lift pins are used to raise the wafer 101 from the pedestal 140 to allow an end-effector to pick the wafer and to lower the wafer 101 after being placed by the end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the shower head 150 and distributed in a space volume defined between the shower head 150 face that faces that wafer 101 and the wafer 101 resting over the pedestal 140. In ALD processes, the gases can be reactants chosen for absorption or reaction with absorbed reactants.

In addition, the control module 110 may be configured for providing instructions to the electrical conduction interface control 130 and the rotating mechanism control 135. In particular, the electrical conduction interface control 130 provides for movement of the electrically conductive interface, for example in the Z-direction (e.g., vertical), such as to provide contact with the spindle and indexer of the rotating mechanism, or a conductive structure for purposes of providing a RF return path. The rotating mechanism control 135 provides for movement of the rotating mechanism, such as movement in the Z-direction, movement of the extensions interfacing with the substrates, rotation of substrates at the end of extensions, etc.

Further, the gases may be premixed or not. Appropriate valving and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 200 that encircles an outer region of the pedestal 140, in one embodiment. The carrier ring 200 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 200 is lifted by spider forks 180. The carrier ring 200 is therefore lifted along with the wafer 101 and can be rotated to another station, e.g., in a multi-station system.

Figure 2:
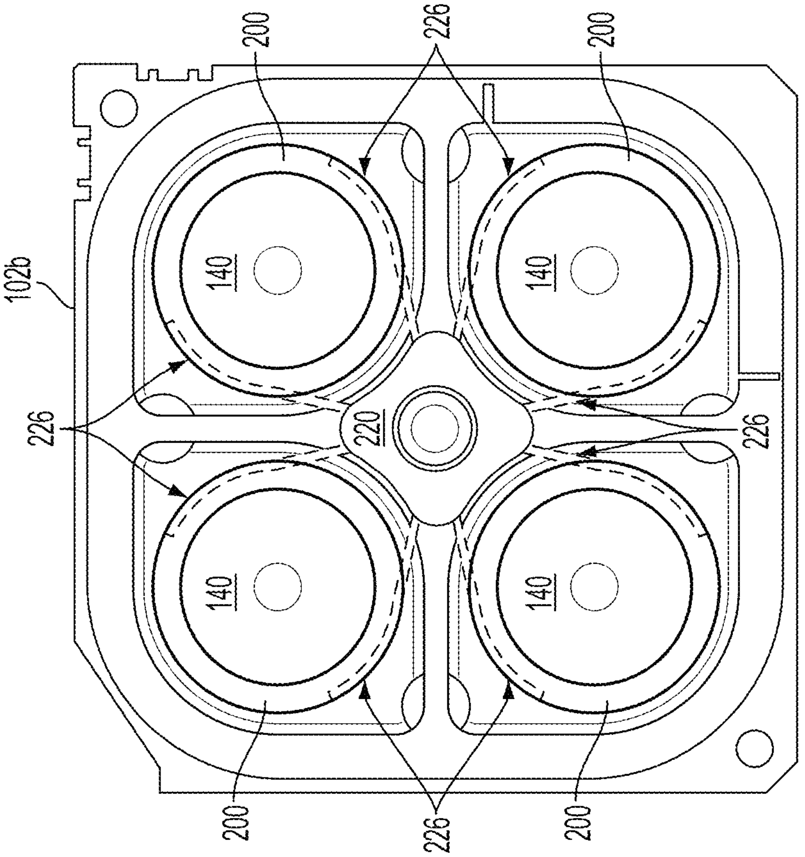
FIG. 2 illustrates a top view of a multi-station processing tool or chamber, wherein four processing stations are provided, in accordance with one embodiment.

FIG. 2 illustrates a top view of a multi-station processing tool, wherein four processing stations are provided. This top view is of the lower chamber portion 102*b* (e.g., with the top chamber portion 102*a* including a top plate 102*c* removed for illustration), wherein four stations are accessed by spider forks 226. Each spider fork, or fork includes a first and second arm, each of which is positioned around a portion of each side of the pedestal 140. In this view, the spider forks 226 are drawn in dash-lines, to convey that they are below the carrier ring 200. The spider forks 226, using an engagement and rotating mechanism 220 are configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101.

Figure 3:
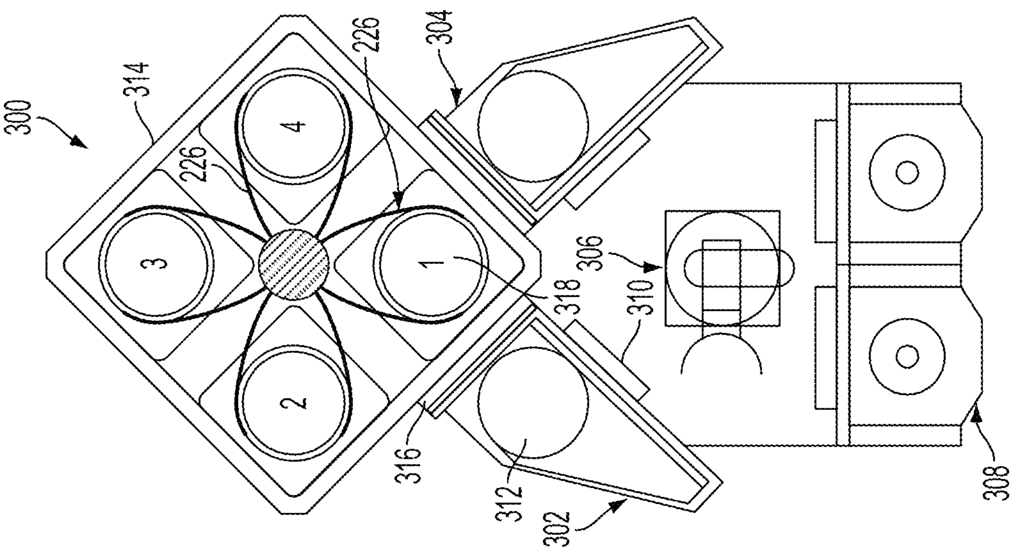
FIG. 3 shows a schematic view of an embodiment of a multi-station processing chamber with an inbound load lock and an outbound load lock, in accordance with one embodiment.

FIG. 3 shows a schematic view of an embodiment of a multi-station processing tool 300 with an inbound load lock 302 and an outbound load lock 304. A robot 306, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 102*b*. Thus, when chamber transport 316 is opened, another robot (not shown) may move the substrate from inbound load lock 302 to a pedestal 140 of a first process station for processing.

The depicted processing chamber 102*b* comprises four process stations, numbered from 1 to 4 in the embodiment shown in FIG. 3. In some embodiments, processing chamber 102*b* may be configured to maintain a low pressure environment so that substrates may be transferred using a carrier ring 200 among the process stations without experiencing a vacuum break and/or air exposure. Each process station depicted in FIG. 3 includes a process station substrate holder (shown at 318 for station 1) and process gas delivery line inlets.

FIG. 3 also depicts spider forks 226 for transferring substrates within processing chamber 102*b*. For example, the chamber includes four spider forks and a carrier ring is disposed around respective pedestals of each of the stations of the multi-station process chamber. The spider forks 226 rotate and enable transfer of substrates from one station to another. The transfer occurs by enabling the spider forks 226 to lift carrier rings 200 from an outer undersurface, which lifts the substrate, and rotates the substrate and carrier together to the next station. In this configuration, the spider forks can simultaneously lift each of the four carrier rings (and any substrate disposed thereon), and rotate all of the carrier rings and substrates to the next station (e.g., for additional or different processing). In some embodiments, the carrier ring may be referred to as a plasma focus ring that functions to focus or optimize the plasma processing across the surface of the substrate, including the edges of the substrate. For instance, the plasma focus ring works to extend the outer surface of the substrate so that non-uniformities at the edge are extended to the outer surface edge of the plasma focus ring (i.e., instead of the substrate edge). In one configuration, the spider forks 226 are made from a ceramic material to withstand high levels of heat during processing.

It is understood that embodiments of the present disclosure may use any suitable means for wafer transfer, delivery, and rotation at each station, or to and from stations. Some embodiments include the use of carrier rings, while other embodiments involve the use of delivery systems that directly interface with a substrate (i.e., no use of rings). For example, in some embodiments, a "ring-less" substrate transfer may also be employed. In such embodiments, the "carrier ring" or "plasma focusing ring" remains fixed on one station, or rings may be absent. The substrate is moved by lifting the substrate off of the pedestal with pins, inserting a paddle under the wafer, and then lowering the substrate on pins thus ensuring direct contact with the paddle to substrate. At this point, the substrate is indexed using the paddle to another station. Once the substrate is at the new station, the substrate is lifted off of the paddle with pins, the paddle is rotated or moved out and the pins are lowered ensure direct contact of the substrate to the pedestal. Now, the substrate processing can proceed at the new station for the indexed (i.e., moved) substrate. When the system has multiple stations, each of the substrates (i.e., those present at stations) can be transferred together. e.g., simultaneously, in the similar fashion for ring-less substrate transfers.

Embodiments of the present disclosure provide for symmetrical RF return paths between a top portion (e.g., top plate) and a bottom portion of a multi-station processing chamber. It is understood that terms such as RF return path. RF return, and the like, refer to the path that the RF return current uses. For example, any RF return currents are simultaneously present with RF signal currents provided by RF power sources for wave propagation. Furthermore, it is understood that the RF return path may follow any low RF impedance path, such as between two or more components (e.g., conductors) of the multi-station processing chamber, even though it may not follow a direct current (DC) capable connection. That is, although there may not be full contact or any contact between components, an RF connection exists that provide for an RF return path. For example, two closely spaced conductors could have a dielectric or vacuum between them to provide a low impendence capacitor that is configured as a RF return path without any DC connection. In general, the presence of an electrically conductive conductor is sufficient to provide the boundary condition needed for RF return currents of the RF return path. As such, while traditional processing chambers include asymmetric conductive boundary conditions, embodiments of the present disclosure improve the symmetry of boundary conditions guiding the RF fields thereby improving symmetry of the discharge of RF power.

Figure 4A:
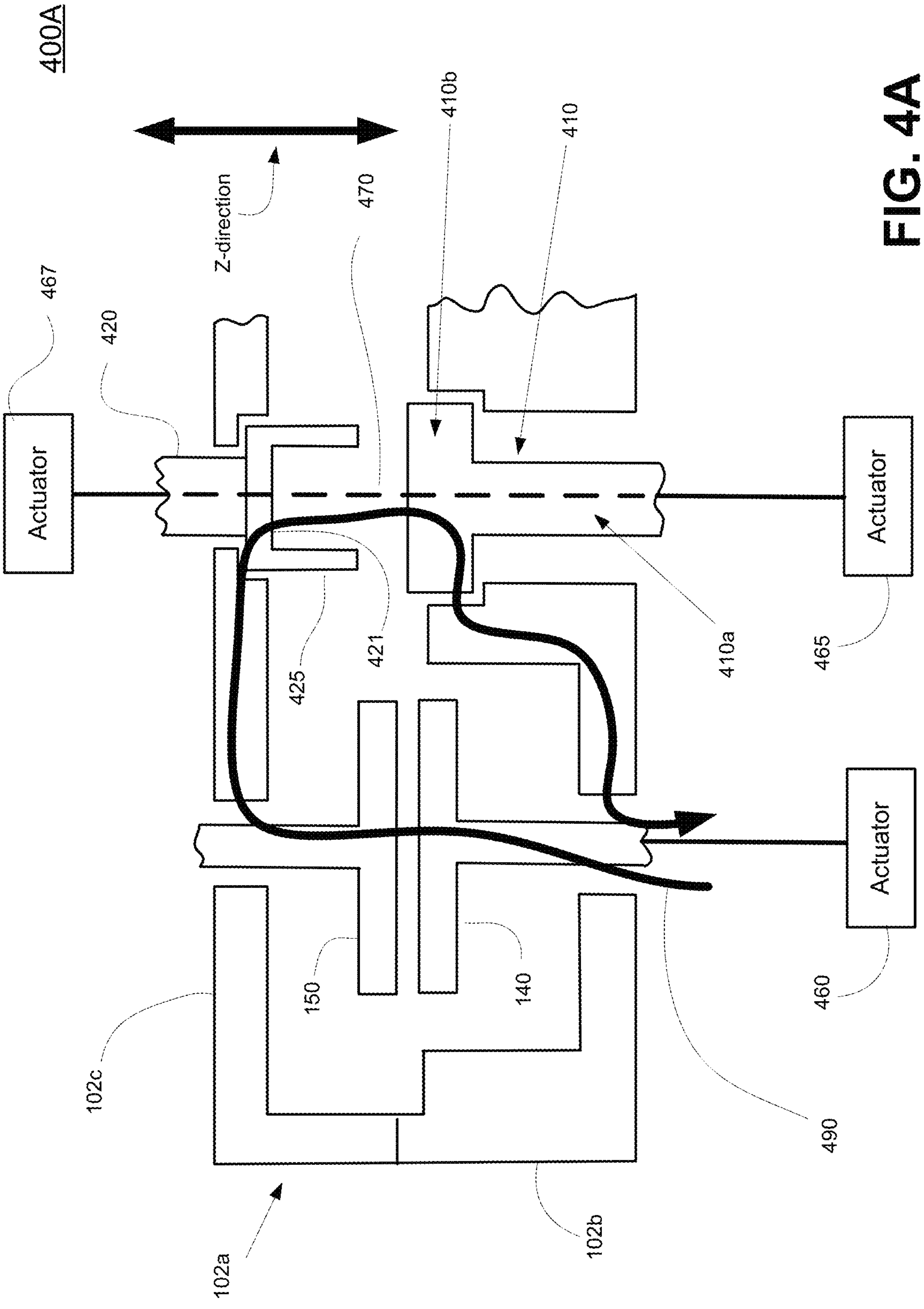
FIG. 4A is a cross-section of a multi-station processing chamber showing an electrically conductive interface electrically coupled to the top of the chamber and configured to contact a rotating mechanism in the center of the chamber to provide symmetric RF return paths for each station, in accordance with one embodiment of the disclosure.

FIG. 4A is a cross-section of a multi-station processing chamber 400A configured to include a central electrical conduction path of the chamber to increase symmetry of RF return paths for one or more stations thereby decreasing non-uniformities across a substrate, in accordance with one embodiment of the present disclosure. In particular, the multi-station processing chamber 400A includes an electrically conductive interface electrically coupled to the top plate of the chamber and is also configured to contact a rotating mechanism in the center of the chamber to provide symmetric RF return paths for each station, in accordance with one embodiment of the disclosure.

As shown, the multi-station processing chamber 400A includes an upper portion 102*a* including a top plate 102*c* and a bottom portion 102*b*. The multi-station processing chamber 400A is configured to enclose a plurality of stations, each of which includes a pedestal 140 (e.g., electrostatic chuck) of a pedestal assembly for supporting a substrate for processing. Only one station is shown in the cross section for purposes of clarity and brevity. As previously described, the upper portion 102*a* includes a shower head 150 is disposed over and aligned with the pedestal 140 of the station, wherein the shower head 150 is electrically connected to the top plate 102*c*.

A rotating mechanism 410 includes a spindle 410 and an indexer 410*b*, which may be any one of a number of indexing mechanisms (e.g., spider forks, arms, etc.). The spindle 410*a* is centrally located between the plurality of stations and is configured to rotate about a central axis 470. The spindle 410*a* is electrically connected to the bottom portion 102*b* (e.g., ferrofluidic seal and bellows assembly (not shown). Actuator 465 is coupled to the spindle 410*a* and is configured for controlling movement of the spindle. In particular, the spindle 410*a* may be rotated, and/or may be moved in the Z-direction. In one embodiment, the actuator 465 may be controlled by control module 110 of FIG. 1.

The rotating mechanism also includes the indexer 410*b* which is connected to the spindle 410*a*, which may also be controlled by the actuator 465. The indexer 410*b* is configured to rotate with the spindle 410*a*. Also, the indexer 410*b* is configured to move in the Z-direction with the movement of the spindle 410*a*. Although not shown, the indexer 410*b* includes a plurality of extensions, each of which is configured to interface with a corresponding substrate for transfer to and from a station, as previously described. For instance, the indexer 410*b* and extensions are configured to engage with substrates and/or carrier rings surrounding substrates, and lift and rotate the substrates and/or carrier rings to the next station. Also, an extension may be configured to rotate the substrate without any rotation of the indexer 410*b*. For purposes of illustration, the extensions may be spider forks in one implementation, or may be arms in other implementations configured for horizontal movement used for interfacing with a substrate, and rotation of the substrate with respect to the extension.

As shown, an electrically conductive structure includes a shaft 420 that is electrically connected to the top plate 102*c*. For example, the electrical connection may be achieved through line bearings to provide for a line connection, or an electrically conductive (e.g., fluid, ferrofluidic, etc.) seal and bellows assembly, etc. The conductive structure includes a connector 421 and an electrically conductive interface 425. The connector 421 provides for physical interfacing between the shaft 420 and the electrically conductive interface 425. In particular, the electrically conductive interface 425 is movably connected to the top plate 102*c* through movement of the shaft 420. For instance, an actuator 467 may be connected to the shaft 420, which is coupled to the electrically conductive interface 425. The actuator 467 may be configured for controlling movement of the electrically conductive interface 425 in the Z-direction. In that manner, the electrically conductive interface 425 is able to move downwards in the Z-direction to make contact with the indexer 410*b*. In particular, contact may be made when the multi-station process chamber is undergoing a plasma process (e.g., depositing a layer using plasma) in order to provide for a symmetric RF return path through the center of the chamber 400A. During plasma processing, each of the plurality of extensions of the indexer 410*b* is parked, and the spindle 410*a* is moved to a lower position during the plasma processing. For example, the indexer and extensions of the indexer may be moved to a position that is below at least a portion of the pedestal 140. That it, the indexer 410*b* and spindle 410*a* are positioned in such a manner to reduce interference with the plasma processing of each of the substrates in the multi-station process chamber 400A.

In one embodiment, a contact interface (not shown) is positioned on the indexer 410*b* to facilitate electrical contact between the electrically conductive interface 425 and the indexer. For example, because the surfaces of the electrically conductive interface 425 and the indexer 410*b* may not be perfectly smooth and planar, the contact between the electrically conductive interface and the indexer may not be ideal. The contact interface may be of a material that is pliable and is able to conform to the surfaces of the electrically conductive interface 425 and the indexer 410*b* in order to provide for a better electrical connection.

As shown, the shaft 420 extends beyond the top plate 102*c* of the upper portion 102*a* of the chamber, and is coupled to the actuator 467. In another embodiment, the shaft is enclosed in a pocket in the top plate 102*c*, and is further connected to the actuator through the top plate 102*c*. For example, movement of the shaft in the Z-direction in either configuration allows for the electrically conductive interface 425 to not interfere with the rotating mechanism 410 during transfer of substrates. In particular, the pocket is configured to receive the electrically conductive interface, or at least a portion of the electrically conductive interface (e.g., portions including the connector 421) when the spindle is moved to an upper position so that the plurality of extensions of the indexer 410*b* can engage with one or more substrates at the stations for substrate transfer and delivery from station to station, and/or for substrate rotation about an extension.

In one embodiment, the electrically conductive interface 425 includes one or more solid tubes, or rods, and the like, and provide a direct conductive path between ends of the electrically conductive interface. For example, the electrically conductive interface 425 may be one or more cylindrical tubes. In another embodiment, the electrically conductive interface 425 is a convoluted cylindrical tube. For example, the electrically conductive interface 425 includes a plurality of interstitial beams horizontally oriented connected by a plurality of vertical links, and provides a non-helical electrical conductive path between the top plate 102*c* and the lower portion 102*b* of the multi-station process chamber 400A. The convoluted cylindrical tube is shown more fully in FIG. 6.

A return path for RF power is shown. In particular, the RF power is provided to the pedestal 140 (e.g., electrostatic chuck) of the pedestal assembly through one or more power sources. The RF power travels through the pedestal 140 via path 490 towards a plasma confinement region located in part between the pedestal 140 and the shower head 150, where reactive gas is supplied through the shower head or openings defined in an electrode assembly (i.e., coming from the bottom portion or top portion of chamber). The RF power generates the plasma of the reactive gas through capacitive coupled plasma (CCP) discharge, for example. The RF power from the plasma confinement region flows through a conductive path defined through the shower head 150 and up through the top plate 102*c*. Instead of only traveling to the sidewalls of the chamber 400A, the RF power flows to the sidewalls of the chamber 400A as well as the electrically conductive structure, and more particularly through the shaft 420, connector 421 and the electrically conductive interface 425. Further, the RF power flows through the rotating mechanism 410, and more particularly through the indexer 410*b* and the spindle 410, and finally to the lower portion 102*b* of the multi-station process chamber 400A.

Figure 4B:
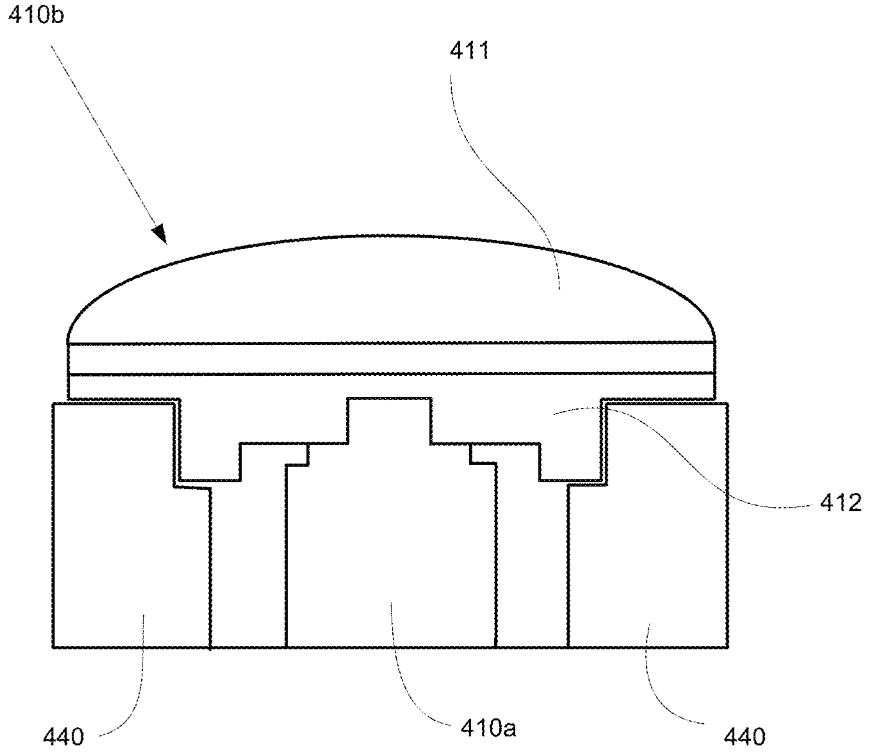
FIG. 4B is a perspective view of a rotating mechanism showing possible RF return paths, in accordance with one embodiment of the disclosure.

FIG. 4B is a perspective view of a rotating mechanism 410 showing possible RF return paths through the indexer, in accordance with one embodiment of the disclosure. In particular, indexer 410*b* may include upper indexer part and a lower indexer part. The indexer may make contact with the spindle 410*a* and/or with an outer wall 490 of a channel 491 within which the spindle 410*a* moves in the Z-direction. The RF power may return to the lower portion 102*b* of the multi-station process chamber 400A via either the outer wall 490 of the channel 491, and/or through the spindle 410*a*.

Figure 5A:
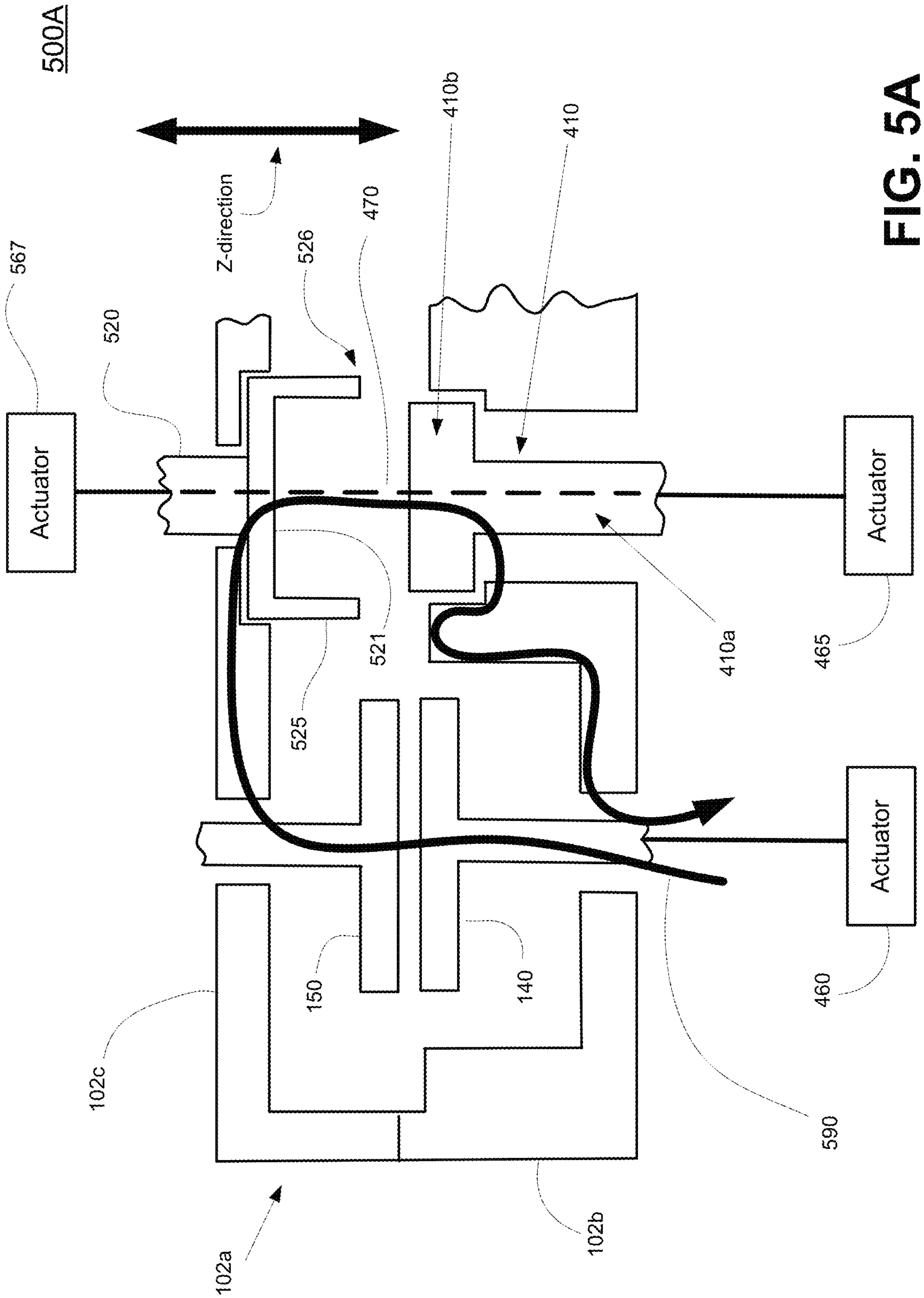
FIG. 5A is a cross-section of a multi-station processing chamber showing an electrically conductive interface electrically coupled to the top of the chamber and configured to contact a conductive structure to provide symmetric RF return paths for each station, in accordance with one embodiment of the disclosure.

FIG. 5A is a cross-section of a multi-station processing chamber 500A configured to include a central electrical conduction path of the chamber to increase symmetry of RF return paths for one or more stations thereby decreasing non-uniformities across a substrate, in accordance with one embodiment of the present disclosure. In particular, the multi-station processing chamber 400A includes an electrically conductive interface electrically coupled to the top plate of the chamber and is also configured to contact a rotating mechanism in the center of the chamber to provide symmetric RF return paths for each station, in accordance with one embodiment of the disclosure. The multi-station processing chamber 500A is similar to the multi-station processing chamber 400A of FIG. 4A, except that the electrically conductive interface 525 is different, and more particularly has a larger footprint than the electrically conductive interface 425 of FIG. 4A, thereby providing for different RF return paths other than through the rotating mechanism 410. As such, between the two figures, components with similar reference numbering have the same features and functionality, and the description provided in relation to FIG. 4A, as well as other figures, is equally applicable to the multi-station processing chamber 500A of FIG. 5A.

In summary, the multi-station processing chamber 500A includes an upper portion 102*a* including a top plate 102*c* and a bottom portion 102*b*, and is configured to enclose stations, each of which includes a pedestal 140 of a pedestal assembly. The upper portion 102*a* includes a shower head 150 aligned over pedestal 140, and is electrically connected to the top plate 102*c*. The centrally located rotating mechanism 410 includes a spindle 410*a* and indexer 410*b* and is configured to both transfer and/or rotate substrates between stations, and to rotate a substrate about an extension of the indexer. The spindle 410*a* rotates about a central axis 470, and moves in the vertical direction along the central axis. The spindle is electrically connected to the bottom portion 102*b* of the chamber 500A (e.g., an electrically conductive seal and bellows assembly, such as an electrically conductive fluid or ferrofluidic seal and bellows assembly—not shown), and is controllably moved by actuator 465. As such, indexer 410*b* is configured to move in the Z-direction with movement of the spindle 410*a*, for rotation with the spindle rotation about the central axis 470, and for horizontal movement of extensions to engage with substrates for transferring between stations, and/or rotation of the substrate about the end of the extension without rotation of the indexer 410*b*.

As shown, an electrically conductive structure includes a shaft 520 that is electrically connected to the top plate 102*c*. For example, the electrical connection may be achieved through line bearings to provide for a line connection, or an electrically conductive (fluid, ferrofluidic, and the like) seal and bellows assembly, etc. The conductive structure includes a connector 521 and an electrically conductive interface 525. The connector 521 provides for physical interfacing between the shaft 520 and the electrically conductive interface 525. In particular, the electrically conductive interface 525 is movably connected to the top plate 102*c* through movement of the shaft 520. For instance, an actuator 567 may be connected to the shaft 520, which is coupled to the electrically conductive interface 525. The actuator 567 may be configured for controlling movement of the electrically conductive interface 525 in the Z-direction.

In one embodiment, the electrically conductive interface 525 has a lower end portion 526 that spans a diameter of the indexer 410*b*. That is, lower end portion 526 may totally surround at least a portion of the indexer 410*b* without physical interface. For example, the electrically conductive interface 525 may be lowered past the top surface of the indexer 410*b* to create an RF path with another conductive structure. That is, the electrically conductive interface is configured to move downwards in the Z-direction to make an RF connection with a conductive structure that is adjacent to the spindle 410*a* and indexer 410*b*, such as during the plasma processing. For example, the electrically conductive interface 525 is able to move via movement of shaft 520 to a position to make an RF connection with another conductive structure (e.g., conductive plate, one or more conductive rods, etc.) that is electrically coupled to the bottom portion 102*b*. In particular, the RF connection may be made when the multi-station process chamber is undergoing a plasma process (e.g., depositing a layer using plasma) in order to provide for a symmetric RF return path through the center of the chamber 400A. During plasma processing, each of the plurality of extensions of the indexer 410*b* is parked, and the spindle is moved to a lower position during the plasma processing. For example, the indexer and extensions of the indexer 410*b* may be moved to a position that is below at least a portion of the pedestal 140. That it, the indexer 410*b* and spindle 410*a* are positioned in such a manner to reduce interference with the plasma processing of each of the substrates in the multi-station process chamber 500A.

A return path for RF power is shown. In particular, the RF power is provided to the pedestal 140 (e.g., electrostatic chuck) of the pedestal assembly through one or more power sources. The RF power travels through the pedestal 140 via path 590 towards a plasma confinement region located in part between the pedestal 140 and the showerhead 150, where reactive gas is supplied through the showerhead or openings defined in a top electrode assembly. The RF power generates the plasma of the reactive gas through capacitive coupled plasma (CCP) discharge, for example. The RF power from the plasma confinement region flows through a conductive path defined through the showerhead 150 and up through the top plate 102*c*. Instead of traveling only to the sidewalls of the chamber 500A, the RF power flows to the sidewalls of the chamber 500A as well as the electrically conductive structure, and more particularly through the shaft 520, connector 521 and the electrically conductive interface 525. Further, the RF power flows through another conductive structure (e.g., conductive plate, one or more conductive rods, etc.) that is RF connected to the electrically conductive interface 525 (e.g., the lower end portion 526), and finally to the lower portion 102*b* of the multi-station process chamber 500A.

Figure 5B:
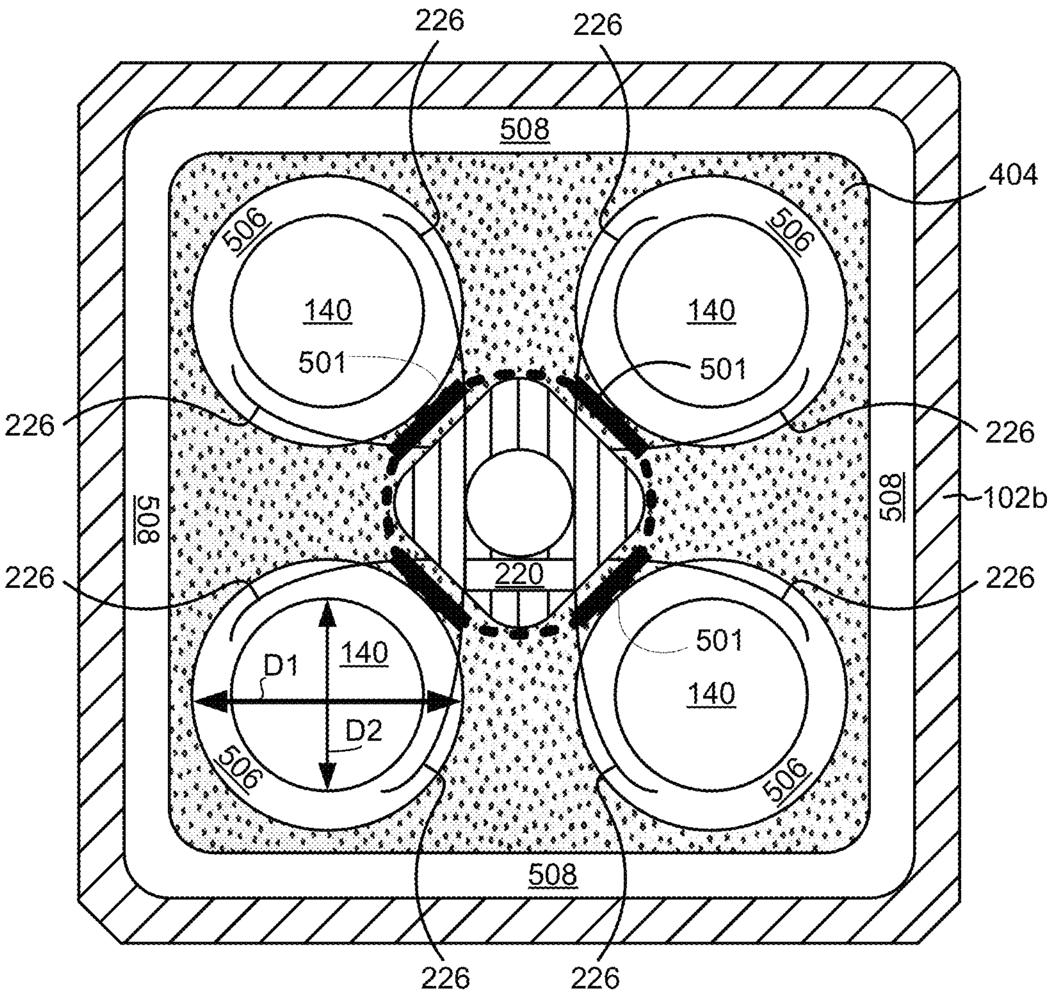
FIG. 5B is an illustration of an RF liner as an electrically conductive structure showing contact points of the electrically conductive interface of FIG. 5A to provide symmetric RF return paths for each station, in accordance with one embodiment of the disclosure.

FIG. 5B is an illustration of a conductive structure (e.g., RF liner) showing contact points of an electrically conductive interface 525 of FIG. 5A to provide symmetric RF return paths for each station, in accordance with one embodiment of the disclosure. In particular, FIG. 5B shows a top view of the lower chamber portion or body 102*b*, which illustrates the positioning of the conductive structure 504 (e.g., formed as a conductive plate). For example, the conductive structure 504 is disposed over the inner walls and attached to the outer walls. The conductive structure 504 has a center opening and a process opening for each station. The center opening is configured to receive the rotating mechanism at the center location. The process opening has a diameter that is larger than a diameter of the carrier ring at each station, and a symmetric gap is defined between an edge of each process opening defined by the conductive structure and an outer edge of a carrier ring.

For example, the electrically conductive structure 504 will include process openings having a diameter D1, in which pedestal 140 will be disposed. In one embodiment, the pedestals, including the carrier ring 200 will have a diameter D2. Accordingly, a gap 506 defined by the difference between diameter D2 and D1 will be provided, such that the symmetric separation between the pedestal and the conductive structure 504 is defined. In addition, another gap 508 is defined between the inner sidewall of the chamber 102*b* and the outer edge of the conductive structure 504. This gap may be varied depending on tolerances, and in some embodiments may be reduced to a point where the conductive structure 504 is touching the inner wall of the lower chamber body 102*b*.

Also, contact points 501 are shown where the electrically conductive interface 525 makes contact with the conductive structure 504. For example, the contact points 501 are shown in solid lines. The outline of the electrically conductive interface 525 is shown in the dotted circle.

Figure 5C:
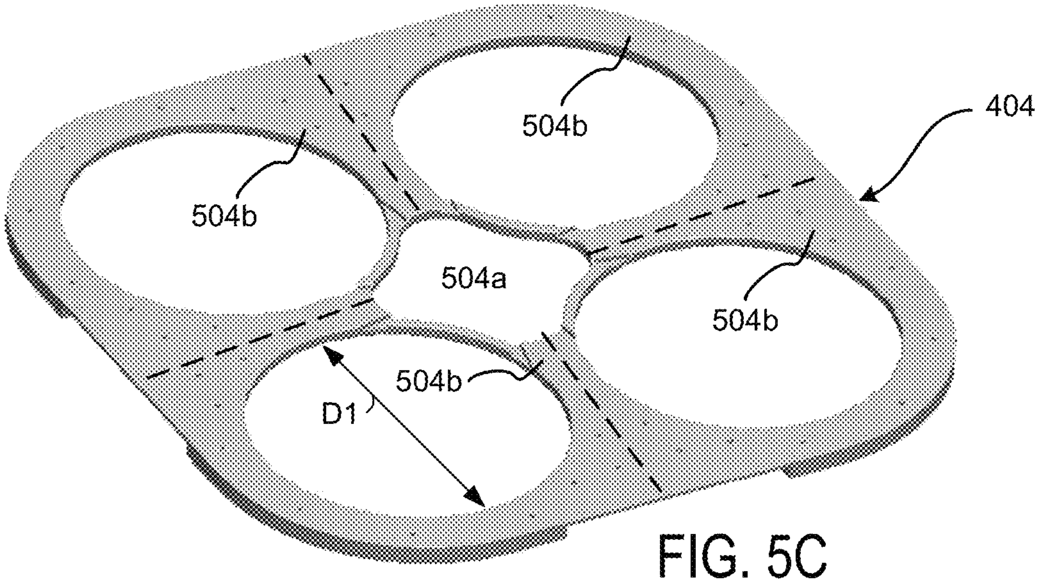
FIG. 5C is a perspective view of an RF liner as the electrically conductive structure of FIG. 5B, in accordance with one embodiment of the disclosure.

FIG. 5C is a perspective view of the conductive structure 504 of FIG. 5B, in accordance with one embodiment of the disclosure. In this example, the process openings are defined to have a diameter D1, as noted above. The diameter D1 is larger than the diameter of the pedestal 140. A center opening 504*a* is used to accommodate the rotating mechanism 220. As noted above, the rotating mechanism 220 will also include spider forks 226, in an exemplary implementation. In other embodiments, instead of spider forks 226, other lifting mechanisms can be used, which can also be provided with a rotating mechanism 220. In various embodiments, the conductive structure 504 may be defined by one or more modules or parts 404*b*, or may be defined as a single unit without the illustrated separation lines.

Figure 6:
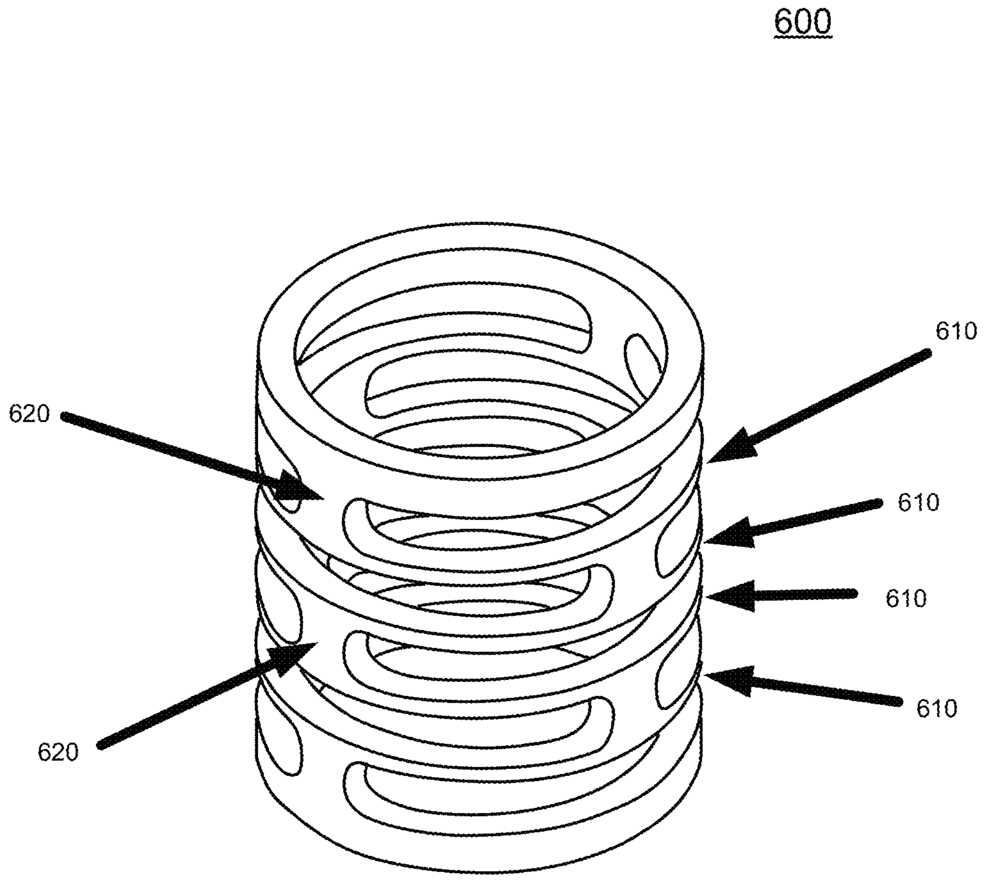
FIG. 6 is a perspective view of an electrically conductive interface configured as a convoluted flexible cylinder, in accordance with one embodiment of the disclosure.

FIG. 6 is a perspective view of an electrically conductive interface 600 configured as a convoluted flexible cylinder, in accordance with one embodiment of the disclosure. In other embodiments, the conductive interface may be solid, such as including one or more solid tubes, rods, and the like. As shown, the electrically conductive interface 600 is a convoluted cylindrical tube. For example, the electrically conductive interface 425 includes a plurality of interstitial beams 620 that are each horizontally oriented and stacked in the vertical direction. In particular, the interstitial beams are connected by a plurality of vertical links 610, such that any two interstitial beams are connected via one or more vertical links.

In one embodiment, the electrically conductive interface 600 is configured as a convoluted flexible tube, wherein the structure provides for a physical compliance so that there is positive connection between the top plate 102*c* and whatever contact point is made with a conductive structure (e.g., spindle, indexer, conductive plate, one or more conductive rods, etc.). That is, there may be some amount of pressure applied between the ends of the electrically conductive interface 600 (e.g., by connecting the upper portion 102*a* and the lower portion 102*b* of the corresponding chamber) to ensure that there is good connection between the top plate 102*c* and whatever conductive structure is implemented. For example, the electrically conductive interface may exhibit mechanically compliant features.

The electrically conductive interface 600 as shown in FIG. 6 provides for a non-helical electrical conductive path between the top plate and the bottom portion 102*c* of a corresponding multi-station process chamber when the electrically conductive interface is in contact with the indexer, or any other conductive structure. Because the RF return current paths are not direct between the ends of the electrically conductive interface 600, the electrically conductive interface produces a less detrimental magnetic field that is less conducive to interfering with plasma processing.

In one embodiment, the electrically conductive interface 600 may go through the indexer 410*b* to directly contact the spindle 410*a*. In other embodiments, the electrically conductive interface 600 makes contact with a surface of the indexer 410*b*. In still other embodiment, the electrically conductive interface 600 makes contact with another conductive structure, such as a conductive plate, one or more conductive rods, etc.

Figure 7:
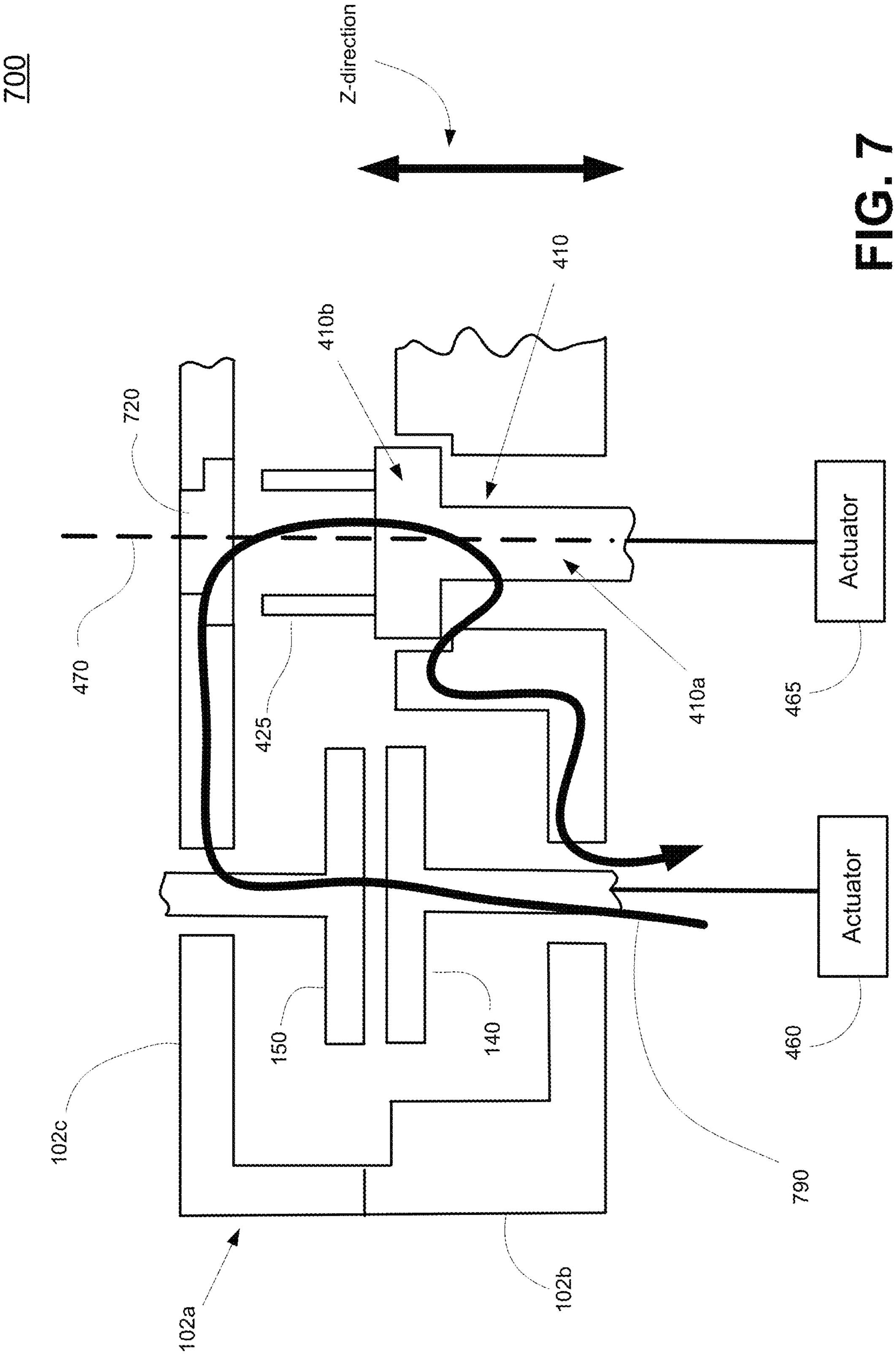
FIG. 7 is cross-section of a multi-station processing chamber showing an electrically conductive interface connected to a rotating mechanism in the center of the chamber, and configured to contact the top plate of the chamber to provide symmetric RF return paths for each station, in accordance with one embodiment of the disclosure.

FIG. 7 is cross-section of a multi-station processing chamber 700 configured to include a central RF path of the chamber to increase symmetry of RF return paths for one or more stations thereby decreasing non-uniformities across a substrate, in accordance with one embodiment of the present disclosure. In particular, the multi-station processing chamber 700 includes an electrically conductive interface connected to a rotating mechanism in the center of the chamber, and is configured to contact the top plate of the chamber to provide symmetric RF return paths for each station, in accordance with one embodiment of the disclosure. Portions of the multi-station processing chamber 700 is similar to the multi-station processing chamber 400A of FIG. 4A. As such, between the two figures, components with similar reference numbering have the same features and functionality, and the description provided in relation to FIG. 4A, as well as other figures, is equally applicable to the multi-station processing chamber 700 of FIG. 7.

In summary, the multi-station processing chamber 700 includes an upper portion 102*a* including a top plate 102*c* and a bottom portion 102*b*, and is configured to enclose stations, each of which includes a pedestal 140 of a pedestal assembly. The upper portion 102*a* includes a shower head 150 aligned over pedestal 140, and is electrically connected to the top plate 102*c*. The centrally located rotating mechanism 410 includes a spindle 410*a* and indexer 410*b* and is configured to both transfer and/or rotate substrates between stations, and to rotate a substrate about an extension of the indexer. The spindle 410*a* rotates about a central axis 470, and moves in the vertical direction along the central axis. The spindle is electrically connected to the bottom portion 102*b* of the chamber 700 (e.g., using an electrically conductive seal and bellows assembly, such as an electrically conductive fluid, ferrofluidic, and the like, seal and bellows assembly—not shown), and is controllably moved by actuator 465. As such, indexer 410*b* is configured to move in the Z-direction with movement of the spindle 410*a*, for rotation with the spindle rotation about the central axis 470, and for horizontal movement of extensions to engage with substrates for transferring between stations, and/or rotation of the substrate about the end of the extension without rotation of the indexer 410*b*.

As shown, an electrically conductive interface 725 is connected to the indexer. As such, because the rotating mechanism 410 is electrically connected to the lower portion 102*b* of the chamber, the electrically conductive interface 725 is also electrically connected to the lower portion of the chamber. As previously described, the spindle 410*a* is configured to move upwards in the Z-direction using the actuator 465. For instance, the spindle 410*a* may be moved to a higher position so that the electrically conductive interface 725 makes an RF connection with the top plate 102*c*, such as during plasma processing. In one implementation, the electrically conductive interface 725 makes an RF connection directly with the top plate 102*c*. In another implementation, the electrically conductive interface 725 makes an RF connection with a receiving interface 720 that is electrically connected to the top plate 102*c*. In this case, only movement of the spindle 410*a* in the Z-direction is needed to bring the electrically conductive interface 725 in an RF connection with the top plate 102*c* and/or the receiving interface 720 in the top plate. As such, the indexer 410*b* and the spindle 410*a* connected to the indexer are configured to move upwards in the Z-direction to a higher position so that the electrically conductive interface 725 makes an RF connection with the top plate 102*c* and/or receiving interface 720, such as during plasma processing.

In particular, the RF connection may be made when the multi-station process chamber 700 is undergoing a plasma process (e.g., depositing a layer using plasma) in order to provide for a symmetric RF return path through the center of the chamber 400A. During plasma processing, each of the plurality of extensions of the indexer 410*b* is parked when the spindle is moved to the higher position during the plasma processing. For example, the indexer and extensions of the indexer 410*b* may be moved to a position that is above at least a portion of the shower head 150. That it, the indexer 410*b* and spindle 410*a* are positioned in such a manner to reduce interference with the plasma processing of each of the substrates in the multi-station process chamber 700.

A return path for RF power is shown. In particular, the RF power is provided to the pedestal 140 (e.g., electrostatic chuck) of the pedestal assembly through one or more power sources. The RF power travels through the pedestal 140 via path 790 towards a plasma confinement region located in part between the pedestal 140 and the showerhead 150, where reactive gas is supplied through the showerhead or openings defined in a top electrode assembly. The RF power generates the plasma of the reactive gas through capacitive coupled plasma (CCP) discharge, for example. The RF power from the plasma confinement region flows through a conductive path defined through the showerhead 150 and up through the top plate 102*c*. Instead of only traveling to the sidewalls of the chamber 500A, the RF power flows to the sidewalls of the chamber 700 as well as the through the center of the chamber, and more particularly through the upper portion 102*b* and/or the receiving interface 720 of the upper portion 102*b*. Further, the RF power flows through the electrically conductive interface 725 that is RF connected with the upper portion 102*b* and/or the receiving interface 720. The RF power then flows through the rotating mechanism 410, and more particularly the indexer 410*b* and the spindle 410*a*, and finally to the lower portion 102*b* of the multi-station process chamber 700.

Figure 8:
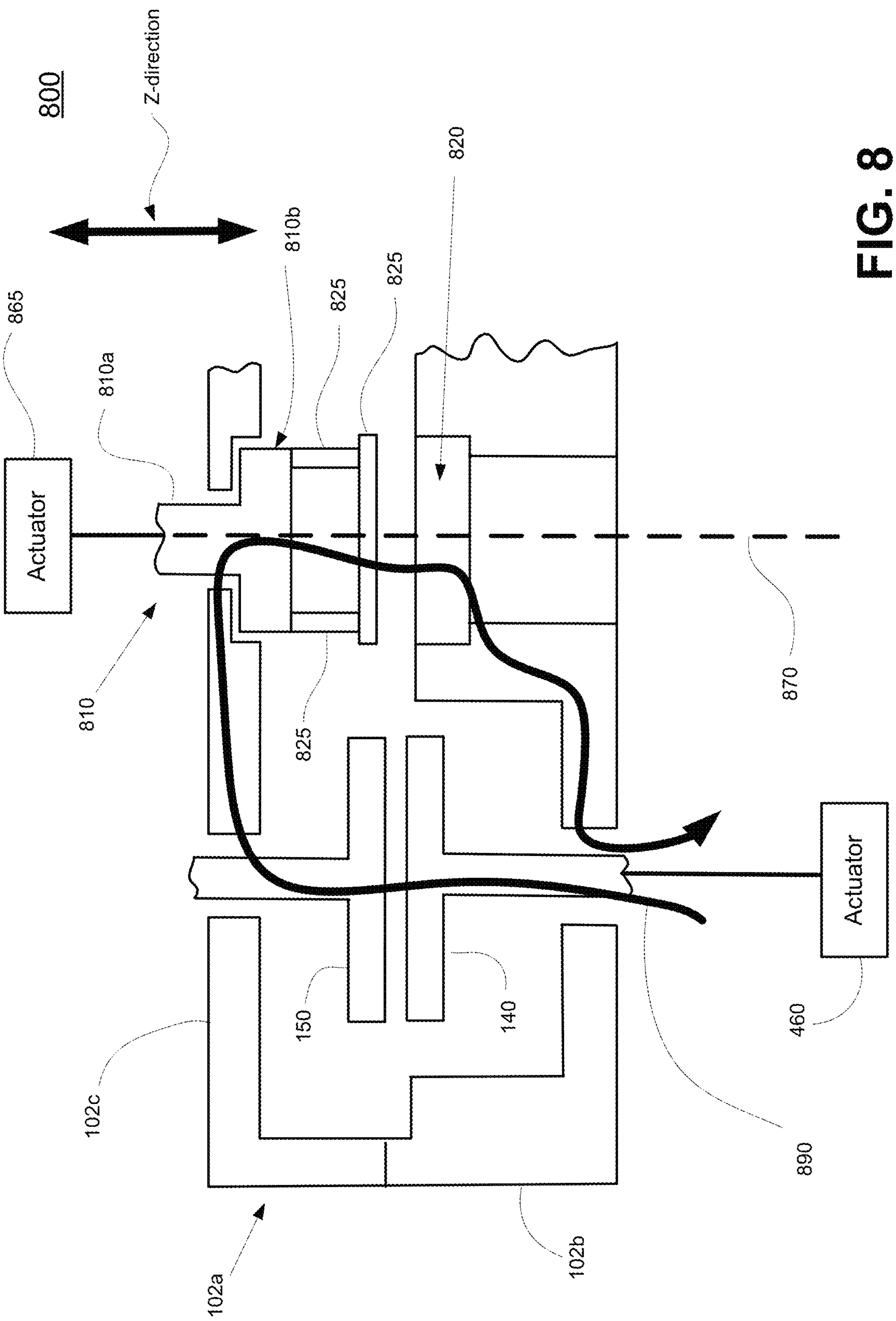
FIG. 8 is a cross-section of a multi-station processing chamber showing an electrically conductive interface connected to a rotating mechanism that is electrically coupled to the top of the chamber and configured to contact a conductive structure in the center of the chamber to provide symmetric RF return paths for each station, in accordance with one embodiment of the disclosure.

FIG. 8 is a cross-section of a multi-station processing chamber 800 configured to include a central electrically conductive path of the chamber to increase symmetry of RF return paths for one or more stations thereby decreasing non-uniformities across a substrate, in accordance with one embodiment of the present disclosure. In particular, the multi-station processing chamber 800 includes an electrically conductive interface connected to a rotating mechanism that is electrically coupled to the top of the chamber and configured to contact a conductive structure in the center of the chamber to provide symmetric RF return paths for each station, in accordance with one embodiment of the disclosure. Portions of the multi-station processing chamber 800 is similar to the multi-station processing chamber 400A of FIG. 4A. As such, between the two figures, components with similar reference numbering have the same features and functionality, and the description provided in relation to FIG. 4A, as well as other figures, is equally applicable to the multi-station processing chamber 800 of FIG. 8.

As shown, the multi-station processing chamber 800 includes an upper portion 102*a* including a top plate 102*c* and a bottom portion 102*b*. The multi-station processing chamber 800 is configured to enclose a plurality of stations, each of which includes a pedestal 140 (e.g., electrostatic chuck) of a pedestal assembly for supporting a substrate for processing. Only one station is shown in the cross section for purposes of clarity and brevity. As previously described, the upper portion 102*a* includes a shower head 150 is disposed over and aligned with the pedestal 140 of the station, wherein the shower head 150 is electrically connected to the top plate 102*c*.

A rotating mechanism 810 includes a spindle 810 and an indexer 810*b*, which may be any one of a number of indexing mechanisms (e.g., spider forks, arms, etc.). The spindle 810*a* is centrally located between the plurality of stations and is configured to rotate about a central axis 870. The rotating mechanism 810 operates within the top plate 102*c* of the chamber, instead of being located in the lower portion 102*b* as shown in previous figures including FIG. 4A. As such, the spindle 810*a* is electrically connected to the top plate 102*c* (e.g., via an electrically conductive seal and bellows assembly, such as an electrically conductive fluid or ferrofluidic seal and bellows assembly—not shown). Actuator 865 is coupled to the spindle 810*a* and is configured for controlling movement of the spindle. In particular, the spindle 810*a* may be rotated about central axis 870, and/or may be moved in the Z-direction. In one embodiment, the actuator 865 may be controlled by control module 110 of FIG. 1.

The rotating mechanism 810 also includes the indexer 810*b* which is connected to the spindle 810*a*, which may also be controlled by the actuator 865. The indexer 810*b* is configured to rotate with the spindle 810*a* about the central axis 870. Also, the indexer 810*b* is configured to move in the Z-direction with the movement of the spindle 810*a*. Although not shown, the indexer 810*b* includes a plurality of extensions, each of which is configured to interface with a corresponding substrate for transfer to and from a station, as previously described. For instance, the indexer 810*b* and extensions are configured to engage with substrates and/or carrier rings surrounding substrates, and lift and rotate the substrates and/or carrier rings to the next station. Also, an extension may be configured to rotate the substrate without any rotation of the indexer 810*b*. For purposes of illustration, the extensions may be spider forks in one implementation, or may be arms in other implementations configured for horizontal movement used for interfacing with a substrate, and rotation of the substrate with respect to the extension.

As shown, an electrically conductive structure includes an electrically conductive interface 825 that is electrically connected to the rotating mechanism 410, and more specifically to the indexer 410*b*. The conductive interface 825 is also electrically conductive. Because the rotating mechanism 810 is electrically connected to the top plate 102*c*, the electrically conductive interface is also electrically connected to the top plate. The electrically conductive structure may also include a connecting interface 830. In addition, a receiving interface 820 (or another conductive structure) is electrically connected to the bottom portion 102*b* of the chamber 800.

The spindle 410*a* is configured to move downwards in the Z-direction using the actuator 865. For instance, the spindle 810*a* may be moved to a lower position so that the electrically conductive interface 825 or the connecting interface 830 makes an RF connection with the receiving interface 820 that is electrically connected to the bottom portion 102*b*, such as during processing. In one implementation, the electrically conductive interface 825 or connecting interface 830 makes an RF connection directly with the bottom portion 102*b* of the chamber. In this case, only movement of the spindle 810*a* in the Z-direction is needed to bring the electrically conductive interface 825 in RF contact (i.e., make an RF connection) with the receiving interface 820) and/or with the lower portion 102*b*. As such, the indexer 810*b* and the spindle 810*a* (connected to indexer 810*b*) are configured to move downwards in the Z-direction to a lower position so that the electrically conductive interface 825 or connecting interface 830 makes an RF connection with the receiving interface 820 or lower portion 102*b* during plasma processing.

In particular, the RF connection may be made when the multi-station process chamber 800 is undergoing a plasma process (e.g., depositing a layer using plasma) in order to provide for a symmetric RF return path through the center of the chamber 800. During plasma processing, each of the plurality of extensions of the indexer 810*b* is parked when the spindle is moved to the lower position during the plasma processing. For example, the indexer and extensions of the indexer 810*b* may be moved to a position that is below at least a portion of the pedestal 140. That it, the indexer 810*b* and spindle 810*a* are positioned in such a manner to reduce interference with the plasma processing of each of the substrates in the multi-station process chamber 800.

A return path for RF power is shown. In particular, the RF power is provided to the pedestal 140 (e.g., electrostatic chuck) of the pedestal assembly through one or more power sources. The RF power travels through the pedestal 140 via path 890 towards a plasma confinement region located in part between the pedestal 140 and the showerhead 150, where reactive gas is supplied through the showerhead or openings defined in a top electrode assembly. The RF power generates the plasma of the reactive gas through capacitive coupled plasma (CCP) discharge, for example. The RF power from the plasma confinement region flows through a conductive path defined through the showerhead 150 and up through the top plate 102*c*. Instead of traveling only to the sidewalls of the chamber 500A, the RF power flows to the sidewalls of the chamber 800 as well as to the center of the chamber, and more particularly through the rotating mechanism 810, and more specifically through the spindle 810*a* and the indexer 810*b*. Further, the RF power flows through a conductive structure, and more specifically through the electrically conductive interface 825 and/or the connecting interface 830. Also, the RF power flows through the receiving interface 820 and/or the lower portion 102*b*, that is in RF contact with (i.e., through an RF connection) the electrically conductive interface 825 and/or the connecting interface 830, and finally to the lower portion 102*b* of the multi-station process chamber 800.

Figure 9:
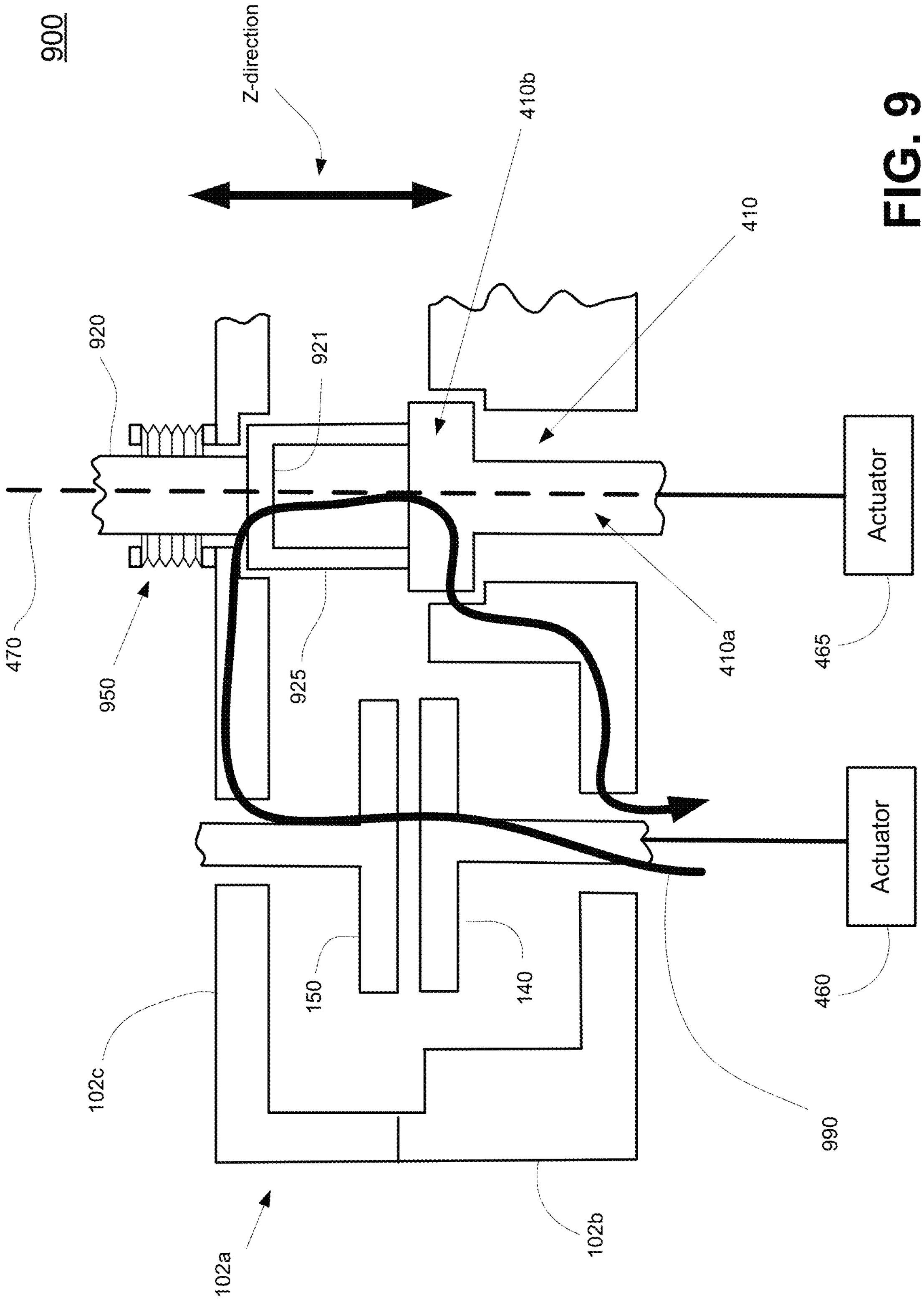
FIG. 9 is a cross-section of a multi-station processing chamber showing an electrically conductive interface configured to provide a continuous electrical connection between a top plate of the chamber and a rotating mechanism in the center of the chamber to provide symmetric RF return paths for each station, in accordance with one embodiment of the disclosure.

FIG. 9 is a cross-section of a multi-station processing chamber 900 configured to include a central RF return path of the chamber to increase symmetry of RF return paths for one or more stations thereby decreasing non-uniformities across a substrate, in accordance with one embodiment of the present disclosure. In particular, the multi-station processing chamber 900 includes an electrically conductive interface configured to provide a continuous electrical connection between a top plate of the chamber and a rotating mechanism in the center of the chamber to provide symmetric RF return paths to ground for each station, in accordance with one embodiment of the disclosure. The multi-station processing chamber 900 is similar to the multi-station processing chamber 400A of FIG. 4A, except for at least the additional configuration of an electrically conductive (e.g., fluid, ferrofluidic, and the like) seal and bellows assembly to provide for the continuous electrical connection. As such, between the two figures, components with similar reference numbering have the same features and functionality, and the description provided in relation to FIG. 4A, as well as other figures, is equally applicable to the multi-station processing chamber 900 of FIG. 9.

In summary, the multi-station processing chamber 500A includes an upper portion 102*a* including a top plate 102*c* and a bottom portion 102*b*, and is configured to enclose stations, each of which includes a pedestal 140 of a pedestal assembly. The upper portion 102*a* includes a shower head 150 aligned over pedestal 140, and is electrically connected to the top plate 102*c*. The centrally located rotating mechanism 410 includes a spindle 410*a* and indexer 410*b* and is configured to both transfer and/or rotate substrates between stations, and to rotate a substrate about an extension of the indexer. The spindle 410*a* rotates about a central axis 470, and moves in the vertical direction along the central axis. The spindle is electrically connected to the bottom portion 102*b* of the chamber 500A (e.g., an electrically conductive seal and bellows assembly, such as an electrically conductive fluid, ferrofluidic, and the like, seal and bellows assembly—not shown), and is controllably moved by actuator 465. As such, indexer 410*b* is configured to move in the Z-direction with movement of the spindle 410*a*, for rotation with the spindle rotation about the central axis 470, and for horizontal movement of extensions to engage with substrates for transferring between stations, and/or rotation of the substrate about the end of the extension without rotation of the indexer 410*b*.

As shown, a conductive structure includes a shaft 920 that is electrically connected to the top plate 102*c*, wherein the shaft moves through a travel space in the top plate 102*c*. For example, the electrical connection may be achieved through a ferrofluidic seal and bellows assembly 950 that is connected to the top plate 102*c* around an opening of the travel space. In that manner, the electrical connection between the conductive structure (i.e., the shaft 920) is continuous with any movement of the shaft 920. In particular, an end of the electrically conductive interface engages with the electrically conductive (e.g., fluid, ferrofluidic, and the like) seal and bellows assembly 950, such as through bearings, to make continuous contact with the top plate 102*c* when the spindle 410*a* is parked or moving in the Z-direction. The conductive structure includes a connector 921 and an electrically conductive interface 925. The connector 921 provides for physical interfacing between the shaft 920 and the electrically conductive interface 925. In particular, the electrically conductive interface 925 and shaft 920 are movably connected to the top plate 102*c* through movement of the spindle 410*a*, as will be described. In particular, the electrically conductive interface 925 is further connected to the rotating mechanism 410, and more particularly to the indexer 410*b* of the rotating mechanism. As such, movement of the spindle 410*a* of the rotating mechanism will translate into movement of the electrically conductive interface 925 and shaft 920 in the Z-direction.

In that manner, there is continuous and electrical contact between the conductive structure (e.g., the electrically conductive interface 925) and the rotating mechanism 410 (i.e., through indexer 410*b*), wherein the rotating mechanism is electrically connected to the lower portion 102*b* at all times, and during plasma processing. As such, the continuous contact between the conductive structure and the rotating mechanism 410 provide for a symmetric RF return path through the through the center of the chamber 900. During plasma processing, each of the plurality of extensions of the indexer 410*b* is parked, and the spindle is moved to a lower position during the plasma processing. For example, the indexer and extensions of the indexer 410*b* may be moved to a position that is below at least a portion of the pedestal 140. In another implementation, because there is continuous connection, during plasma processing each of the extensions of the indexer 410*b* is parked when the spindle is moved to a higher position during the plasma processing. For example, the indexer and extensions of the indexer 410*b* may be moved to a position that is higher than at least a portion of the shower head 150. That is, in either implementation the indexer 410*b* and spindle 410*a* are positioned in such a manner to reduce interference with the plasma processing of each of the substrates in the multi-station process chamber 900.

A return path for RF power is shown. In particular, the RF power is provided to the pedestal 140 (e.g., electrostatic chuck) of the pedestal assembly through one or more power sources. The RF power travels through the pedestal 140 via path 990 towards a plasma confinement region located in part between the pedestal 140 and the showerhead 150, where reactive gas is supplied through the showerhead or openings defined in a top electrode assembly. The RF power generates the plasma of the reactive gas through capacitive coupled plasma (CCP) discharge, for example. The RF power from the plasma confinement region flows through a conductive path defined through the showerhead 150 and up through the top plate 102*c*. Instead of traveling only to the sidewalls of the chamber 900, the RF power flows to sidewalls of the chamber 900 as well as to the conductive structure, and more particularly through the shaft 920, connector 921 and the electrically conductive interface 925. Further, the RF power flows through the rotating mechanism 410 (i.e., the indexer 410*b*) that is in contact or RF connected with the electrically conductive interface 925, and finally to ground through the lower portion 102*b* of the multi-station process chamber 900.

FIGS. 10A-10F are diagrams showing drop-in passive or active apparatuses configured for facilitating an RF return path between an upper portion and a lower portion of a multi-station processing chamber, in accordance with one embodiment of the present disclosure. In particular, embodiments of the present disclosure describe a drop-in spindle post or similar component that can be self-actuating, or otherwise passive and require no input or actuation from the multi-station processing chamber. The drop-in spindle post or similar component can be a stand-alone item that can be added to a multi-station processing chamber post production.

Figure 10A:
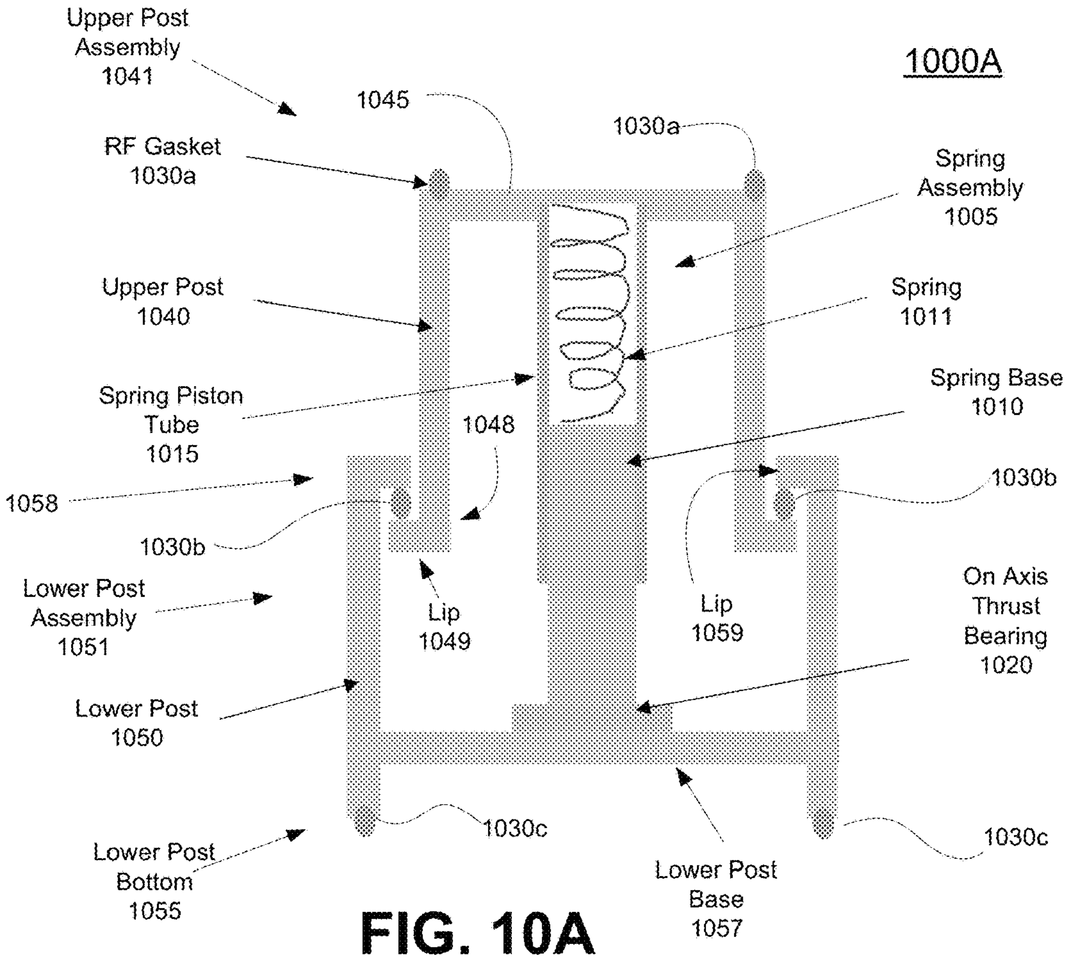
FIGS. 10A-10F are diagrams showing drop-in passive or active apparatuses configured for facilitating an RF return path between an upper portion and a lower portion of a multi-station processing chamber, in accordance with one embodiment of the present disclosure.

FIG. 10A illustrates an apparatus 1000A configured for facilitating an RF return path between an upper portion and a lower portion of a multi-station processing chamber, in accordance with one embodiment of the present disclosure. In one implementation, the drop-in apparatus can be preassembled, and then placed on a spindle of a multi-station processing chamber, after which the chamber may be closed. The apparatus may be passive or otherwise self-actuating as long as they are configured to provide a conductive RF return path, as previously described in relation to FIGS. 1-9. That is, the apparatus 1000A may be placed into the systems and apparatus of the previously described FIGS. 4A, 5A, 7, 8, and 9 with modifications. Further, the apparatus 1000A may not be placed in the center of the multi-station processing chamber (e.g., centered on a spindle and indexer assembly). For example, the apparatus 1000A may be off-center, as long as an RF return path is provided that exhibits improved symmetry about a station (i.e., RF return paths through the sidewalls as well as the center of the multi-station processing chamber about each of the stations.

The apparatus 1000A includes an upper post assembly 1041 that is electrically conductive. In particular, the upper post assembly includes an upper post 1040 electrically connected to a top portion 1045 of the upper post assembly. In one implementation, the upper post 1040 is cylindrical. The upper post assembly 1041 includes a bottom portion 1048, which includes a lip 1049.

The apparatus 1000A includes a lower post assembly 1051 that is electrically conductive, and that is movably connected to the upper post assembly 1041. The upper post assembly 1041 and the lower post assembly 1051 are configured to provide an RF return path between a top plate and a bottom portion 102*b* of a multi-station processing chamber. In particular, the lower post assembly includes a lower post 1050 that is electrically connected to a bottom 1055 of the lower post assembly. In one implementation, the lower post 1050 is cylindrical. In addition, the lower post assembly includes a base 1057 that is connected to the lower post 150. The lower post assembly 1051 includes a top portion 1058, which includes a lip 1059.

That apparatus 1000A also includes an optional spring assembly 1005 electrically connected to the upper post assembly and the lower post assembly, wherein the spring assembly is configured to move the lower post assembly 1051 in relation to the upper post assembly 1041. In particular, the spring assembly includes a spring base 1010 that is electrically connected to the lower post assembly 1051. A spring piston tube 1015 is in electrical contact with the upper post assembly 1041, wherein the spring piston tube is movably connected to the spring base 1010. A spring 1011 is in contact with and makes electrical contact with the spring base 1010 and the upper post assembly 1041, and is configured to move within the spring piston tube 1015. For example, the spring 1011 is configured to push against the top portion 1045 of the upper post assembly 1041.

Further, the apparatus 1000A includes an on axis thrust bearing 1020 electrically connected to the spring base 1010 and the base 1057 of the lower post assembly 1051. In particular, the on axis thrust bearing 1020 is configured to allow for rotation of the lower post assembly 1051 without rotation of the upper post assembly 1041. That is, as the lower post assembly 1051 rotates with a corresponding rotation mechanism (e.g., spindle and indexer assembly), the thrust bearing 1020 is configured such that the spring base 1010 does not rotate along with the rotation of the lower post assembly 1051 and corresponding rotation mechanism.

The apparatus 1000A includes one or more optional RF gaskets 1030, each of which is configured to make a corresponding RF connection between two components. In particular, an RF gasket 1030*a* is positioned on the upper post assembly 1041 and is configured to make an RF connection with a top plate of the multi-station processing chamber. For example, the RF gasket 1030*a* is positioned on the top portion 1045 of the upper post assembly. In addition, an RF gasket 1030*b* is configured to make an RF connection between the upper post assembly 1041 and the lower post assembly 1051. For example, the RF gasket 1030*b* is positioned between the lip 1049 positioned on the bottom portion 1048 of the upper post assembly 1041 and a lip 1059 positioned on the upper portion 1058 of the lower post assembly 1051. The interaction between the RF gasket 1030*b* the upper post assembly 1041 and the lower post assembly 1051 provides for enough compliance up chamber opening and closing, and still provide for RF contact to be maintained throughout the top portion of the chamber, apparatus 1000A, and bottom portion of the chamber. Further, an RF gasket 1030*c* is positioned on the lower post assembly 1051 and is configured make an RF connection between the lower post assembly 1051 and a bottom portion 102*b* of the multi-station processing chamber.

Figure 10B:
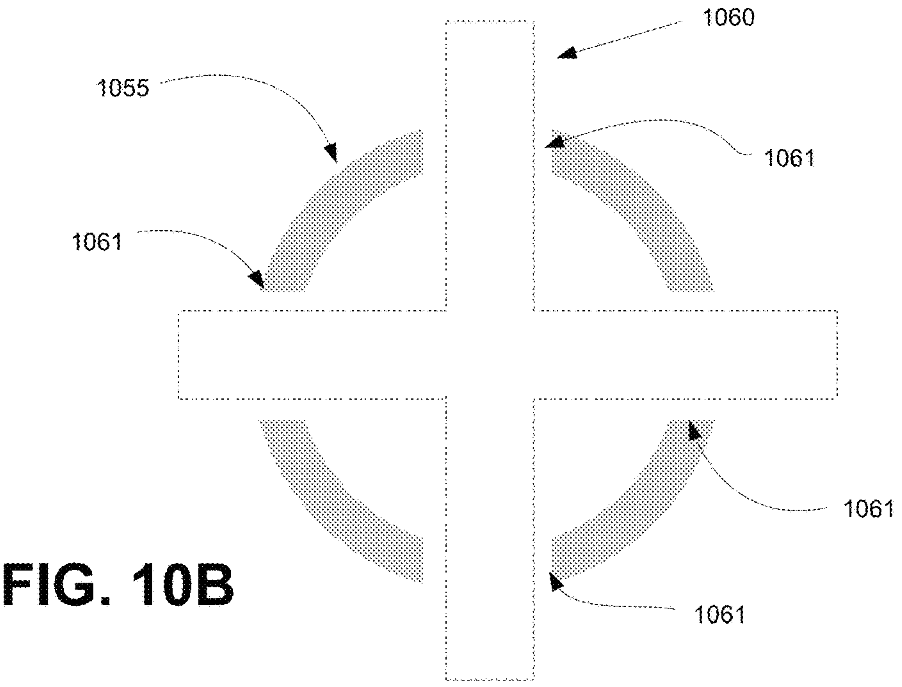

FIG. 10B is a diagram illustrating the bottom 1055 of the lower post assembly 1051. In particular, bottom 1055 includes gaps 1061. The openings in the gaps 1061 allow for movement of extensions through the gaps, wherein the extensions 1060 are configured within a rotating mechanism 410 (e.g., an indexer) for substrate delivery and/or rotation.

Figure 10C:
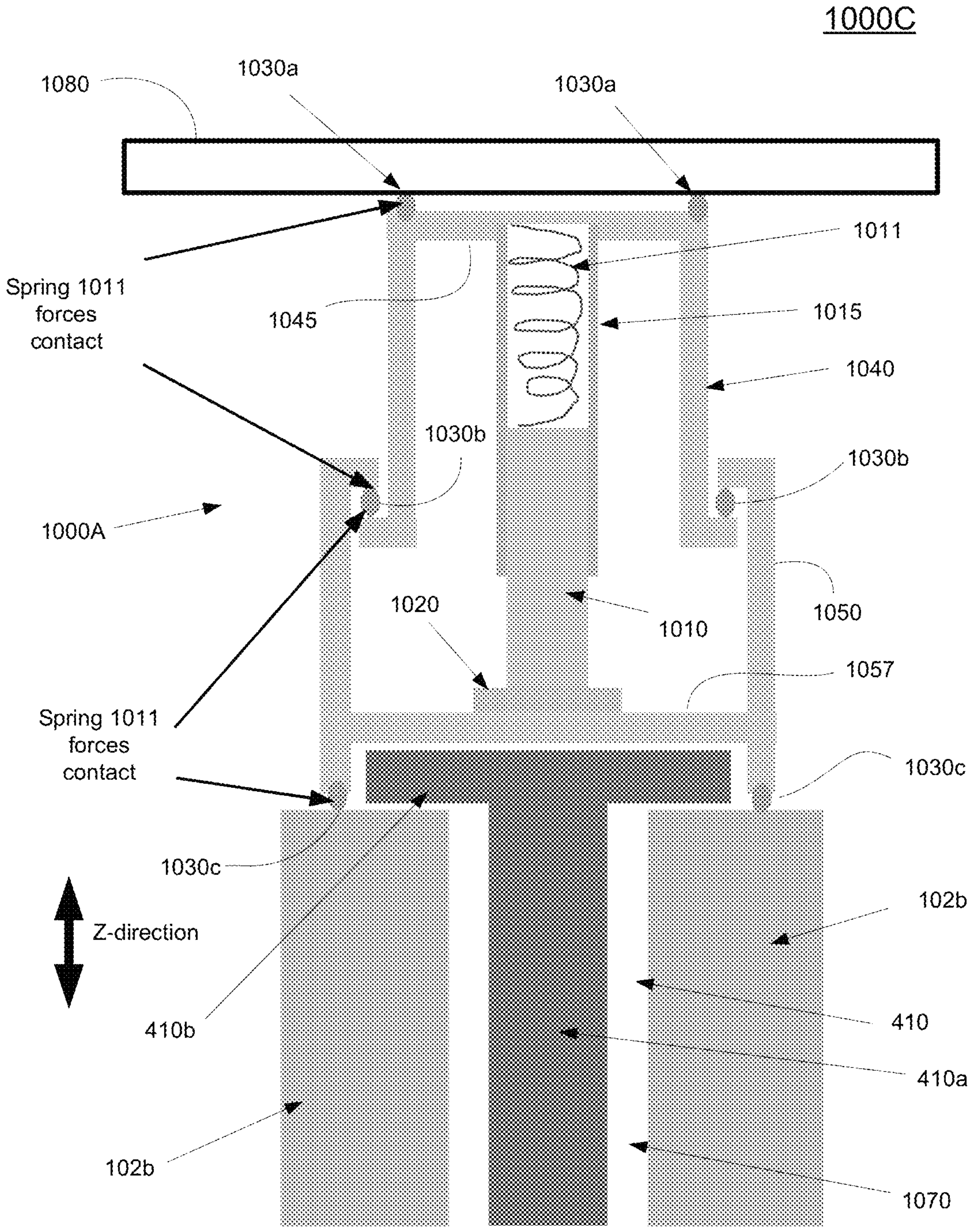

FIG. 10C is a diagram 1000C illustrating the interaction of the apparatus 1000A of FIG. 10A with a top plate and bottom portion of a multi-station processing chamber. For example, the apparatus 1000A is positioned on top of the rotating mechanism 410, and below the receiving interface 1080. In one implementation, the receiving interface 1080 is electrically connected to the top plate 102*c* of the multi-station processing chamber. In another embodiment, the apparatus is positioned below the top plate 102*c*, without the use of the receiving interface 1080. The spring assembly is configured to keep the apparatus 1000A positioned between the top portion and the bottom portion of the multi-station processing chamber. That is, no matter the position of the spindle 410*a*, the spring 1011 is configured to force the top portion 1045 of the upper post assembly 1041 towards the receiving interface 1080, and more particularly, to make a continuous RF connection between the receiving interface 1080 and the upper post assembly 1041.

As shown, the lower post assembly is configured to surround a rotating mechanism 410, including a spindle 410 and indexer 410*b*. More specifically the lower post assembly is configured to surround the indexer 410*b* that is connected to a spindle 410*a*. The spindle 410*a* is centrally located between the plurality of stations and is configured to rotate about a central axis. The spindle 410*a* is electrically connected to the bottom portion 102*b* (e.g., ferrofluidic seal and bellows assembly—not shown), and may be actuated with an actuator, previously described, such that the spindle 410*a* may be rotated, and/or may be moved in the Z-direction. That is, spindle 410*a* may move within a travel space 1070 of the bottom portion 102*b* of the chamber. Also, the base 1057 of the lower post assembly 1051 is configured to make contact with the rotating mechanism 410, and more specifically to make contact with the indexer 410*b*.

More particularly, when the spindle 410*a* that is connected to the indexer 410*b* is at a lower position (e.g., during plasma processing), the bottom 1055 of the lower post assembly 1051 is RF connected to the bottom portion 102*b* of the multi-station processing chamber via the RF gasket 1030*c*. In addition, the lip 1049 positioned on a bottom portion 1048 of the upper post assembly 1041 is RF connected to the lip 1059 positioned on an upper portion 1058 of the lower post assembly 1051 via the RF gasket 1030*b*. As previously described, the spring 1011 is configured to make a continuous RF connection between the receiving interface 1080 and the upper post assembly 1041. As shown, the spring 1011 forces contact between the receiving interface 1080 and the top portion 1045 of the upper post assembly 1041, and forces contact between lip 1059 and 1049, and forces contact between the bottom 1055 and the bottom portion 102*b* of the multi-station processing chamber.

Figure 10D:
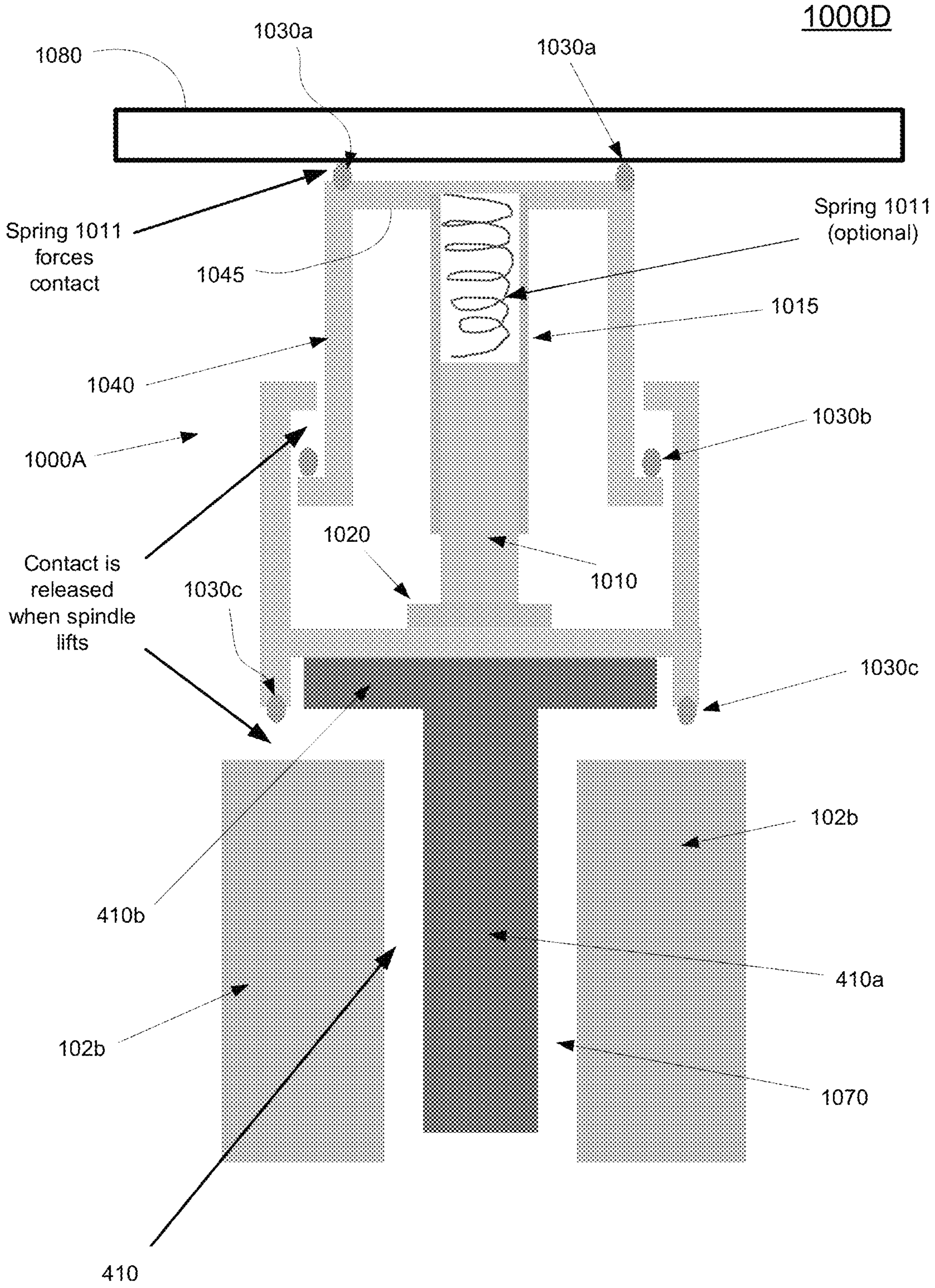

FIG. 10D is a diagram 1000D illustrating the interaction of the apparatus 1000A of FIG. 10A with a top plate and bottom portion of a multi-station processing chamber, as previously described in relation to FIG. 10C. As previously described, the spring assembly is configured to keep the apparatus 1000A positioned between the top portion and the bottom portion of the multi-station processing chamber. That is, no matter the position of the spindle 410*a*, the spring 1011 is configured to force the top portion 1045 of the upper post assembly 1041 towards the receiving interface 1080, and more particularly, to make a continuous RF connection between the receiving interface 1080 and the upper post assembly 1041. FIG. 10D is similar to FIG. 10C except that the position of the spindle 410*a* is different, and the description of referenced components in FIG. 10C is applicable to similarly referenced components in FIG. 10D.

More particularly, when the spindle 410*a* that is connected to the indexer 410*b* is at an upper position (e.g., during substrate transfer and/or rotation), the bottom 1055 of the lower post assembly 1051 is separated from the bottom portion 102B of the multi-station processing chamber. That is, there is no RF connection between the bottom 1055 and the bottom portion 102B. In addition, the lip 1049 positioned on a bottom portion 1048 of the upper post assembly 1041 is separated from the lip 1059 positioned on an upper portion 1058 of the lower post assembly 1051. That is, there is no RF connection between the lip 1049 and the lip 1059, and as such, there is no RF connection between the upper post assembly 1041 and the lower post assembly 1051. As previously described, the spring 1011 is configured to make a continuous RF connection between the receiving interface 1080 and the upper post assembly 1041, such that spring 1011 forces contact between the receiving interface and the top portion 1045 of the upper post assembly 1041. However, because the spindle 410*a* is in the upper position, the spring 1011 is compressed and contact is released between lip 1049 and lip 1059, and also releases contact between the bottom 1055 of the lower post assembly 1051 and the bottom portion 102*b* of the multi-station processing chamber.

Figure 10E:
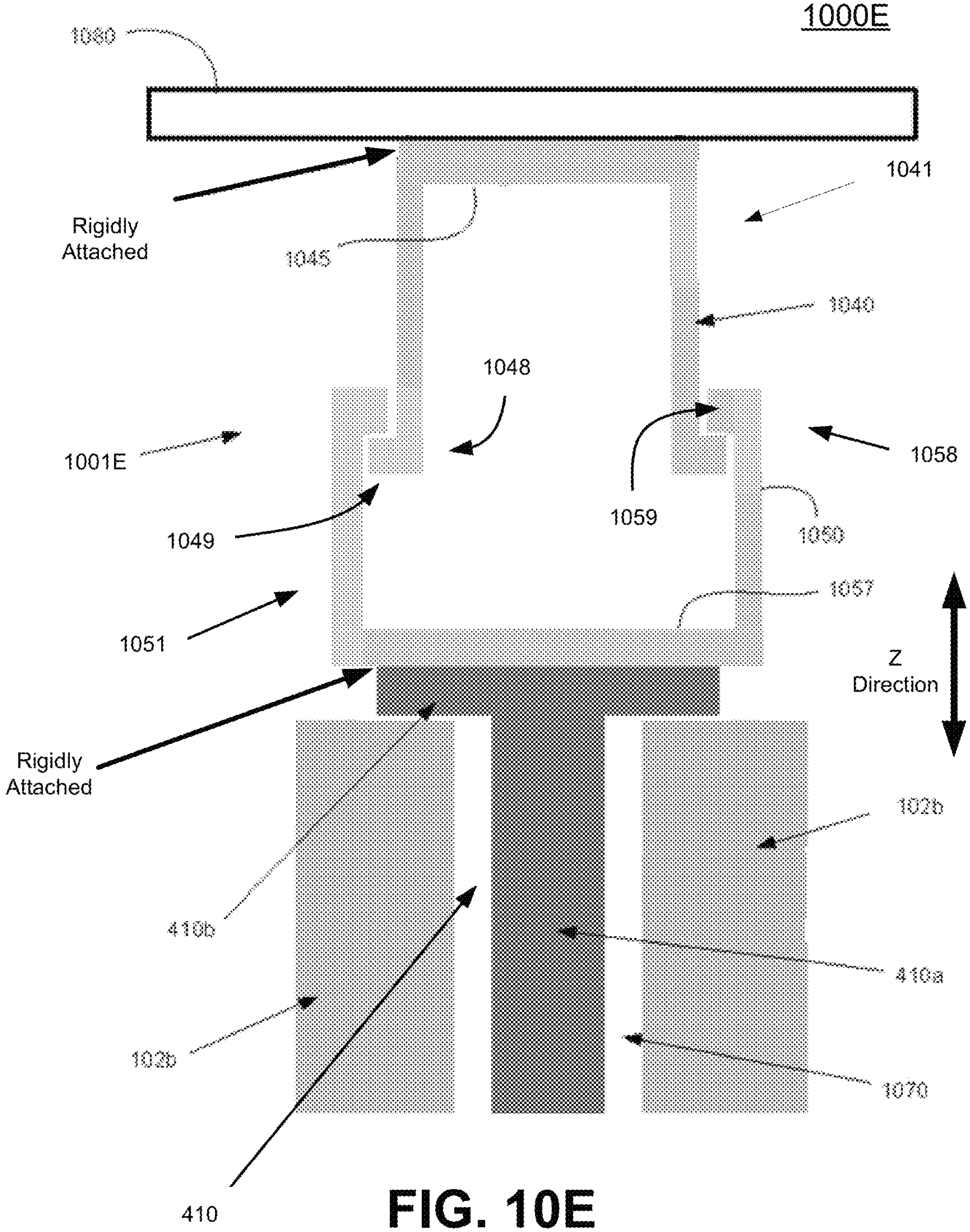

FIG. 10E is a diagram 1000E illustrating the interaction of apparatus 1001E with a top plate and/or receiving interface 1080 and a bottom portion 102*b* of a multi-station processing chamber, in accordance with one embodiment of the present disclosure. For example, the apparatus 1001E is positioned on top of the rotating mechanism 410, and below the receiving interface 1080. In one implementation, the receiving interface 1080 is electrically connected to the top plate 102*c* of the multi-station processing chamber. In another embodiment, the apparatus is positioned below the top plate 102*c*, without the use of the receiving interface 1080.

Apparatus 1001E is similarly configured as the apparatus 1000A of FIG. 10A, except that there is no bottom 1055. In particular, apparatus 1001E is configured for facilitating an RF return path between an upper portion and a lower portion of a multi-station processing chamber. In one implementation, the apparatus 1001E may be configured for drop-in assembly or interfacing with the multi-station processing chamber, and may be pre-assembled, and then placed on a spindle 410*b*, after which the chamber may be closed. Apparatus 1001E may be passive or otherwise self-actuating as long as it is configured to provide a conductive RF return path, as previously described in relation to FIGS. 1-9. That is, the apparatus 1001E may be placed into the systems and apparatus of the FIGS. 4A, 5*a*, and 7-9 with modifications. Further, apparatus 1001E may be placed in the center of the multi-station processing chamber (e.g., centered on a spindle and indexer assembly), or may be placed off-center from the spindle and indexer assembly, as long as an RF return path is provided that exhibits improved symmetry about a station (i.e., RF return paths through the sidewalls as well as towards the center of the multi-station processing chamber).

As shown, the apparatus 1001E includes an upper post assembly 1041 that is electrically conductive, and includes an upper post 1040 electrically connected to a top portion 1045. The upper post assembly 1041 includes a bottom portion 1048, which includes a lip 1049. Also, the apparatus 1001E includes a lower post assembly 1051 that is electrically conductive, and that is movably connected to the upper post assembly 1041. The lower post assembly 1051 includes a lower post 1050 that is connected to a base 1057. The lower post assembly 1051 includes a top position 1058, which includes lip 1059.

The upper post assembly 1041 and the lower post assembly 1051 are configured to provide an RF return path between a top plate and a bottom portion 102*b* of the multi-station processing chamber. In particular, the base 1057 of the lower post assembly 1051 is rigidly attached and electrically connected to indexer 410*b* of the rotating mechanism 410. In addition, the top portion 1045 is rigidly attached and electrically connected to the receiving interface 1080 and/or directly attached to the top plate of the multi-station processing chamber. As such, the apparatus 1001E is positioned between the upper portion and the lower portion of the multi-station processing chamber no matter the position of the spindle 410*a*. The apparatus 1001E is configured to provide a continuous RF return path (i.e., a continuous RF connection) between an upper portion and a lower portion of the multi-station processing chamber no matter the position of the rotating mechanism 410 (i.e., the RF return path is maintained as spindle 410*a* moves vertically up and down). For example, spindle 410*a* is electrically connected to bottom portion 102*b* (e.g., ferrofluidic seal and bellows assembly—not shown), and may be actuated with an actuator, previously described, such that the spindle 410*a* may be rotated and/or may be moved in the Z-direction, such that the spindle 410*a* may move within travel space 1070 of the bottom portion 102*b*.

Figure 10F:
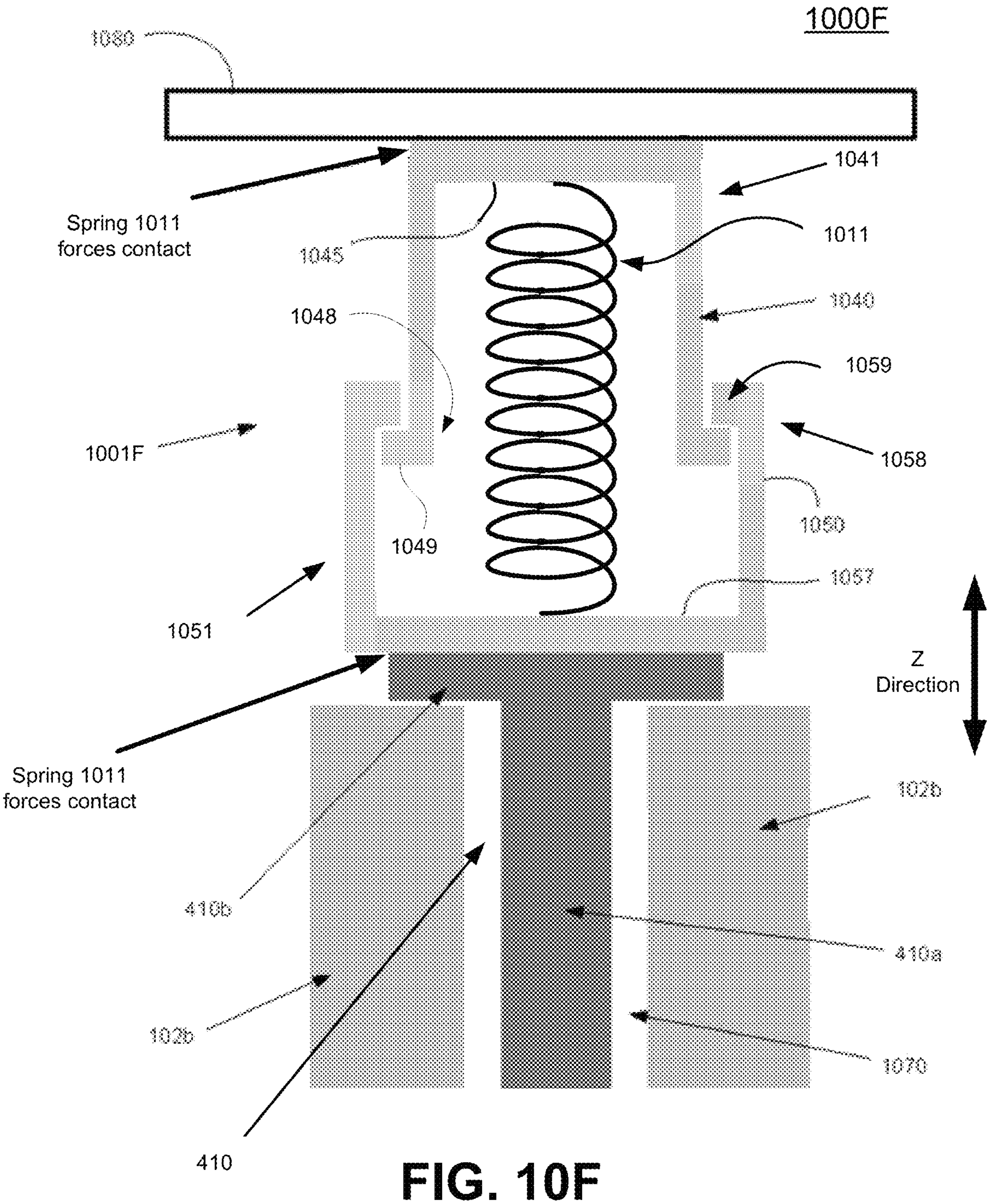

FIG. 10F is a diagram 1000F illustrating the interaction of apparatus 1001F with a top plate and/or receiving interface 1080 and a bottom portion 102*b* of a multi-station processing chamber, in accordance with one embodiment of the present disclosure. For example, the apparatus 1001F is positioned on top of the rotating mechanism 410, and below the receiving interface 1080. In one implementation, the receiving interface 1080 is electrically connected to the top plate 102*c* of the multi-station processing chamber. In another embodiment, the apparatus is positioned below the top plate 102*c*, without the use of the receiving interface 1080.

Apparatus 1001F is similarly configured as the apparatus 1001E of FIG. 10E, except that there is a spring 1011 used for making electrical contact between apparatus 1001F and the upper portion and lower portion of a multi-station processing chamber. In particular, apparatus 1001E is configured for facilitating an RF return path between the upper portion and the lower portion. In particular, the apparatus 1001F may be configured for drop-in assembly or interfacing with the multi-station processing chamber, as previously described. Apparatus 1001F may be passive or otherwise self-actuating and configured to provide a conductive RF return path. As such, the apparatus 1001F may be placed into the systems and apparatus of the FIGS. 4A. 5*a*, and 7-9 with modifications. Further, apparatus 1001F may be placed in the center of the multi-station processing chamber (e.g., centered on a spindle and indexer assembly), or may be placed off-center from the spindle and indexer assembly, as long as an RF return path is provided that exhibits improved symmetry about a station (i.e., RF return paths through the sidewalls as well as towards the center of the multi-station processing chamber.

In summary, apparatus 1001F includes an upper post assembly 1041 and a lower post assembly 1051 that are electrically conductive. The lower post assembly 1051 is movably connected to the upper post assembly 1041, as previously described.

The upper post assembly 1041 and the lower post assembly 1051 are configured to provide an RF return path between a top plate and a bottom portion 102*b* of the multi-station processing chamber. In particular, apparatus 1001F includes a spring 1011 that is connected to the base 1057 that is connected to the lower post 1050 of the lower post assembly 1051. Also, spring 1011 is connected to the top portion 1045 that is connected to the upper post 1040 of the upper post assembly 1041. The spring 1011 is configured to push against the top portion 1045 of the upper post assembly 1041 and push against the base 1057 of the lower post assembly 1051. That is, spring 1011 forces contact between the top portion 1045 and the receiving interface 1080, and forces contact between the base 1057 and the indexer 410*b* of the rotation mechanism 410. As such, the spring 1011 is configured to make a continuous RF connection between the upper portion and lower portion of the multi-station processing chamber no matter the positioning of the spindle 410*a* (i.e., whether in a downwards, or upwards, or intermediate position). Specifically, the spring 1011 and apparatus 1001F are configured to create an RF return path via the receiving interface 1080, the upper post assembly 1041, the lower post assembly 1051 and the rotating mechanism 410 (e.g., the indexer 410*b*).

Further, the apparatus 1001F is positioned between the upper portion and the lower portion of the multi-station processing chamber no matter the position of the spindle 410*a*. As shown, when the spindle 410*a* is in a downwards position, the spring 1011 forces contact between the receiving interface 1080 and the top portion 1045 of the upper post assembly 1041, and also forces contact between the lips 1059 and 1049, and also forces contact between the base 1057 of the lower post assembly 1051 and the bottom portion 102*b* of the multi-station processing chamber. In embodiments, the top portion 1045 is not rigidly attached to the receiving interface 1080, and the base 1057 is not rigidly attached to the rotation mechanism 410 (e.g., indexer 410*b*). In another embodiment, at the top portion 1045 is rigidly attached to the receiving interface 1080 or the base 1057 is rigidly attached to the rotation mechanism 410.

Figure 11:
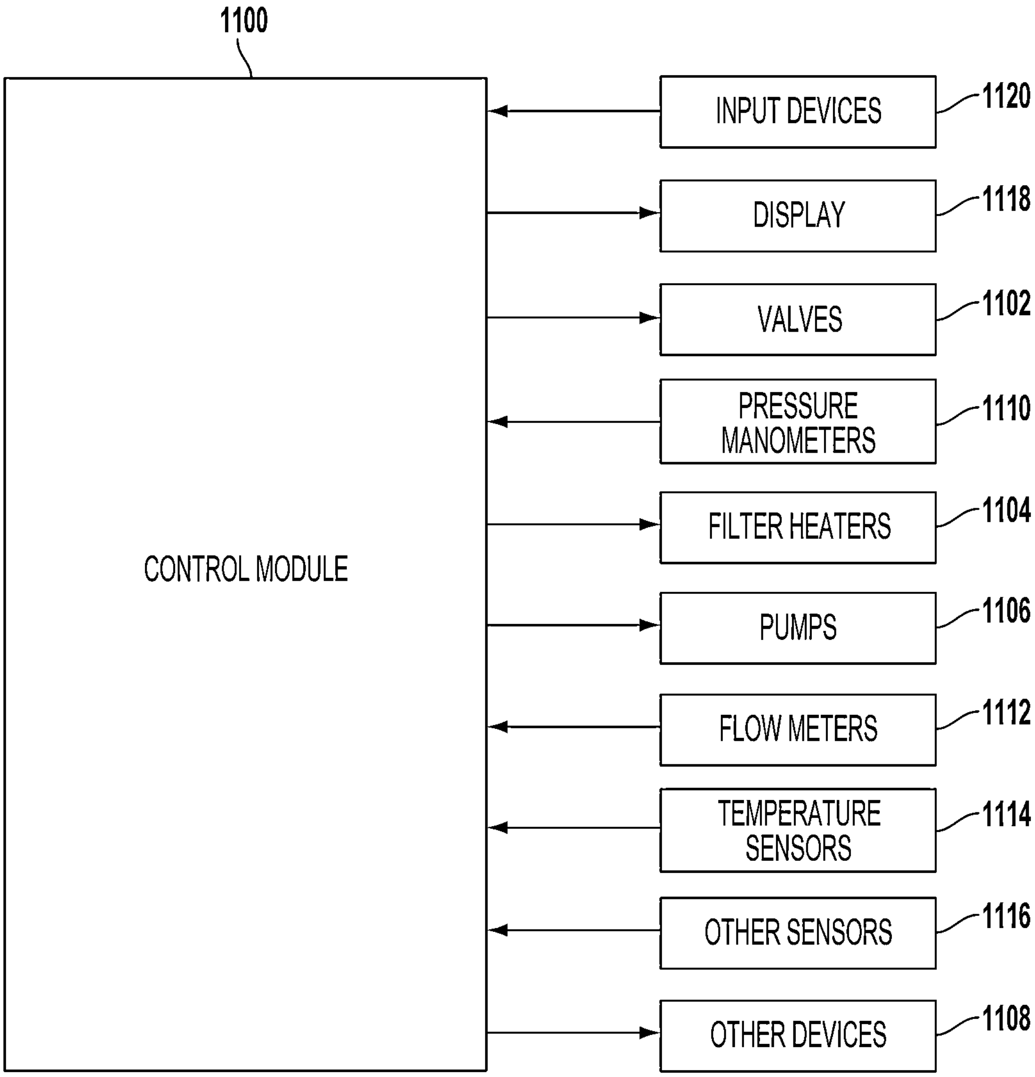
FIG. 11 shows a control module for controlling the systems described above.

FIG. 11 shows a control module 1100 for controlling the systems described above. For instance, the control module 1100 may include a processor, memory and one or more interfaces. The control module 1100 may be employed to control devices in the system based in part on sensed values. For example only, the control module 1100 may control one or more of valves 1102, filter heaters 1104, pumps 1106, and other devices 1108 based on the sensed values and other control parameters. The control module 1100 receives the sensed values from, for example only, pressure manometers 1110, flow meters 1112, temperature sensors 1114, and/or other sensors 1116. The control module 1100 may also be employed to control process conditions during precursor delivery and deposition of the film. The control module 1100 will typically include one or more memory devices and one or more processors. In one implementation, control module 1100 may include the control module 110 of FIG. 1.

The control module 1100 may control activities of the precursor delivery system and deposition apparatus. The control module 1100 executes computer programs including sets of instructions for controlling process timing, delivery system temperature, and pressure differentials across the filters, valve positions, mixture of gases, chamber pressure, chamber temperature, substrate temperature, RF power levels, substrate chuck or pedestal position, delivery of purge gases, and other parameters of a particular process. The control module 1100 may also monitor the pressure differential and automatically switch vapor precursor delivery from one or more paths to one or more other paths. Other computer programs stored on memory devices associated with the control module 1100 may be employed in some embodiments.

Typically there will be a user interface associated with the control module 1100. The user interface may include a display 1118 (e.g., a display screen and/or graphical software displays of the apparatus and/or process conditions), and user input devices 1120 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, purge gas flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive processes, including the delivery of purge gas. Examples of programs or sections of programs for this purpose include substrate positioning code, process gas control code, purge gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. Purge gas control program may include code for controlling the delivery of purge gas. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 1110, and thermocouples located in delivery system, the pedestal or chuck, and state sensors 1120. Appropriately programmed feedback and control algorithms may be used with data from these sensors to maintain desired process conditions. The foregoing describes implementation of embodiments of the disclosure in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, delivery of purge gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, a plasma enhanced chemical vapor deposition (PECVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. An apparatus, comprising:

a multi-station processing chamber including a top plate and a bottom portion, the multi-station processing chamber configured to enclose a plurality of stations each including a pedestal assembly for supporting a substrate for processing;

a spindle centrally located between the plurality of stations and configured to rotate about a central axis, wherein the spindle is electrically connected to the bottom portion;

a first actuator coupled to the spindle and configured for controlling movement of the spindle in a Z-direction;

an indexer connected to the spindle and configured to rotate with the spindle, wherein the indexer includes a plurality of extensions, each of the plurality of extensions configured to interface with a corresponding substrate for transfer to and from a corresponding station;

an electrically conductive interface movably connected to the top plate; and a second actuator coupled to the electrically conductive interface and configured for controlling movement of the electrically conductive interface in the Z-direction;

wherein the electrically conductive interface is configured to move downwards in the Z-direction to make contact with the indexer when the each of the plurality of extensions is parked and the spindle is moved to a lower position during plasma processing.

2. The apparatus of claim 1, wherein the electrically conductive interface comprises one or more solid cylindrical tubes.

3. The apparatus of claim 1, wherein the electrically conductive interface comprises a convoluted cylindrical tube including a plurality of interstitial beams horizontally oriented connected by a plurality of vertical links.

4. The apparatus of claim 3, wherein the electrically conductive interface provides for a non-helical electrical conductive path between the top plate and the bottom portion when the electrically conductive interface is in contact with the indexer.

5. The apparatus of claim 1, wherein the multi-station processing chamber includes four stations.

6. The apparatus of claim 1, further comprising:

a pocket in the top plate that is configured to receive the electrically conductive interface when the spindle is moved to an upper position so that the plurality of extensions of the indexer can engage with one or more substrates at the plurality of stations.

7. The apparatus of claim 1, further comprising:

a contact interface positioned on the indexer to facilitate an RF return path between the electrically conductive interface and the indexer, wherein the contact interface is pliable.

8. The apparatus of claim 1, wherein an RF return path to the bottom portion is generated through the electrically conductive interface, indexer, and spindle.

9. The apparatus of claim 1, wherein the electrically conductive interface is configured to move in the downwards in the Z-direction to make contact with an outer wall of a channel within which the spindle moves in the Z-direction.

10. The apparatus of claim 1, wherein the indexer comprises:

an upper indexer part; and a lower indexer part.

11. The apparatus of claim 1, wherein the each of the plurality of extensions is configured to rotate the corresponding substrate.

12. An apparatus, comprising:

a multi-station processing chamber including a top plate and a bottom portion, the multi-station processing chamber configured to enclose a plurality of stations each including a pedestal assembly for supporting a substrate for processing;

a spindle centrally located between the plurality of stations and configured to rotate about a central axis;

a first actuator coupled to the spindle and configured for controlling movement of the spindle in a Z-direction;

an indexer connected to the spindle and configured to rotate with the spindle about the central axis, wherein the indexer includes a plurality of extensions, each of the plurality of extensions configured to interface with a corresponding substrate for transfer to and from a corresponding station;

an electrically conductive interface movably connected to the top plate; and a second actuator coupled to the electrically conductive interface and configured for controlling movement of the electrically conductive interface in the Z-direction;

wherein the electrically conductive interface has a lower end portion that spans a diameter of the indexer, wherein the electrically conductive interface is configured to move downwards in the Z-direction to make contact with a conductive structure adjacent to the spindle and indexer when the each of the plurality of extensions is parked and the spindle is moved to a lower position during plasma processing, wherein the conductive structure is electrically coupled to the bottom portion.

13. The apparatus of claim 12, wherein the conductive structure is an RF liner configured to surround a plurality of pedestals of the plurality of stations.

14. The apparatus of claim 12, wherein the conductive structure is one or more conductive rods.

15. The apparatus of claim 12, wherein the electrically conductive interface comprises one or more solid cylindrical tubes.

16. The apparatus of claim 12, wherein the electrically conductive interface comprises a convoluted cylindrical tube including a plurality of interstitial beams horizontally oriented connected by a plurality of vertical links, wherein the electrically conductive interface provides for a non-helical electrical conductive path between the top plate and the bottom portion when the electrically conductive interface is in contact with the indexer.

17. The apparatus of claim 12, wherein the multi-station processing chamber includes four stations.

18. The apparatus of claim 12, further comprising:

a pocket in the top plate that is configured to receive the electrically conductive interface when the spindle is moved to an upper position so that the plurality of extensions of the indexer can engage with one or more substrates at the plurality of stations.

19. The apparatus of claim 12, wherein an RF return path to the bottom portion is generated through the electrically conductive interface and the conductive structure.

20. The apparatus of claim 12, wherein the indexer comprises:

an upper indexer part; and a lower indexer part.

21. The apparatus of claim 12, wherein the each of the plurality of extensions is configured to rotate the corresponding substrate.

* * * * *